United States Patent
Okada

(10) Patent No.: US 7,608,832 B2
(45) Date of Patent: Oct. 27, 2009

(54) IMAGE DETECTION DEVICE AND METHOD OF DRIVING IMAGE DETECTOR

(75) Inventor: Yoshihiro Okada, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/213,601

(22) Filed: Jun. 23, 2008

(65) Prior Publication Data

US 2009/0001275 A1 Jan. 1, 2009

(30) Foreign Application Priority Data

Jun. 26, 2007 (JP) ............... 2007-167114
Jan. 31, 2008 (JP) ............... 2008-021612

(51) Int. Cl.
*G01T 1/24* (2006.01)
(52) U.S. Cl. ............... 250/370.08
(58) Field of Classification Search ........ 250/370.01–370.15; 378/98.8
See application file for complete search history.

(56) References Cited

U.S. PATENT DOCUMENTS

| | | | | |
|---|---|---|---|---|
| 4,675,739 A * | 6/1987 | Catchpole et al. | ......... | 378/98.8 |
| 5,852,296 A * | 12/1998 | Tsukamoto et al. | ..... | 250/370.09 |
| 5,981,931 A * | 11/1999 | Kinno et al. | ............. | 250/208.1 |
| 6,798,453 B1 * | 9/2004 | Kaifu | ......................... | 348/304 |
| 2007/0120063 A1 * | 5/2007 | Adachi | .................. | 250/370.09 |

FOREIGN PATENT DOCUMENTS

EP 660421 A2 * 6/1995
JP 2003-319264 11/2003

* cited by examiner

*Primary Examiner*—David P Porta
*Assistant Examiner*—Kiho Kim
(74) *Attorney, Agent, or Firm*—Sheldon J. Moss; Margaret A. Burke

(57) ABSTRACT

An image detection device has an image detector equipped with a detection section having a charge generation section that receives irradiation of electromagnetic waves and generates charges, a storage capacitor in which two electrodes are disposed so as to oppose one another and which accumulates charges generated at the charge generation section, and a TFT switching element for reading out charges accumulated in the storage capacitor. At a time before a point in time of reading out of charges from the storage capacitor via the switching element of the image detector, a reference potential of the storage capacitor is varied by a variable Cs power source, and leak current sufficiently flows before reading out of a charge signal from the image detector. Leak current is thereby reduced sufficiently at a time of reading out the charge signal.

20 Claims, 18 Drawing Sheets

LEAK CURRENT CHARACTERISTIC OF TFT SWITCH

LEAK CURRENT CHARACTERISTIC OF TFT SWITCH

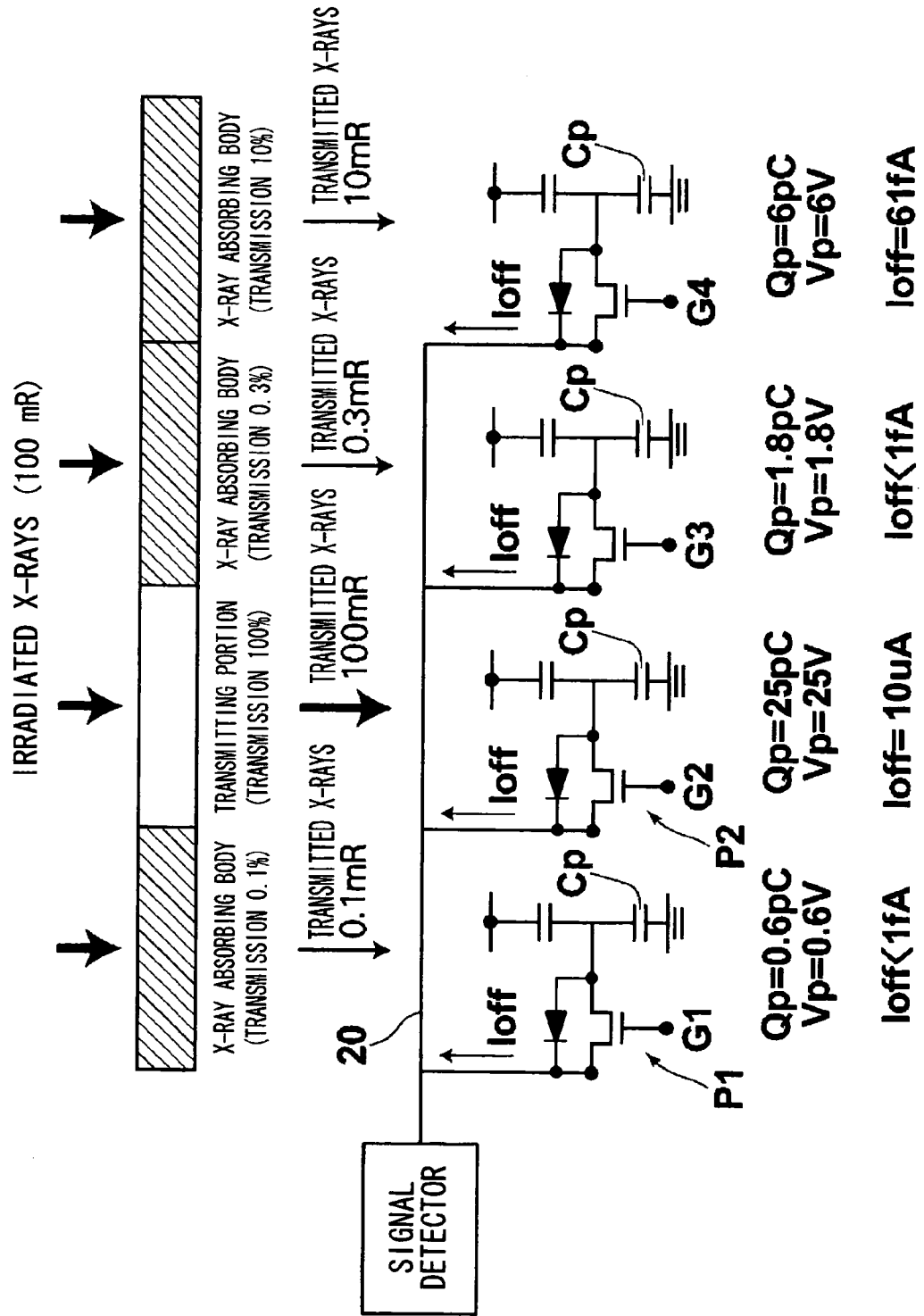

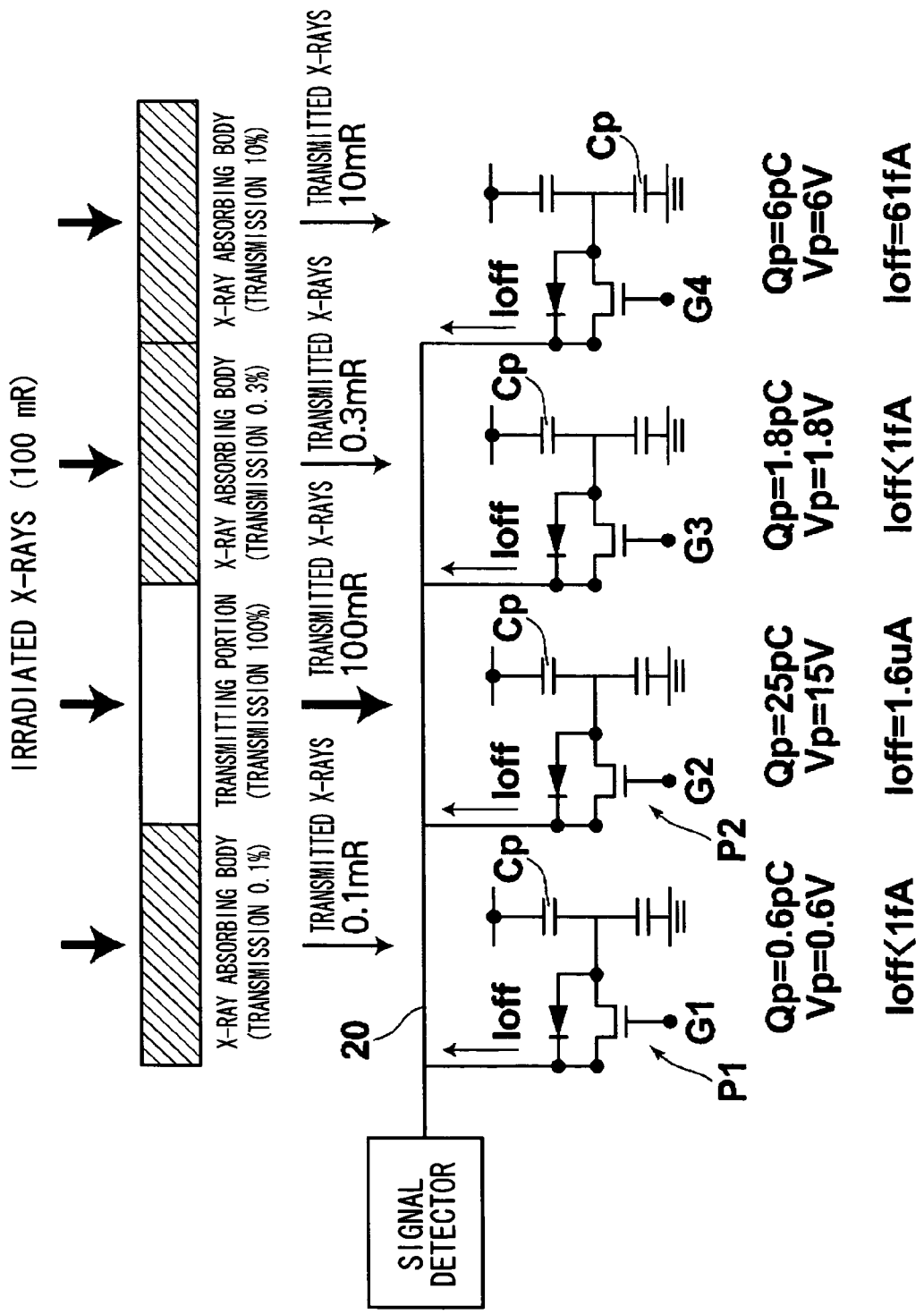

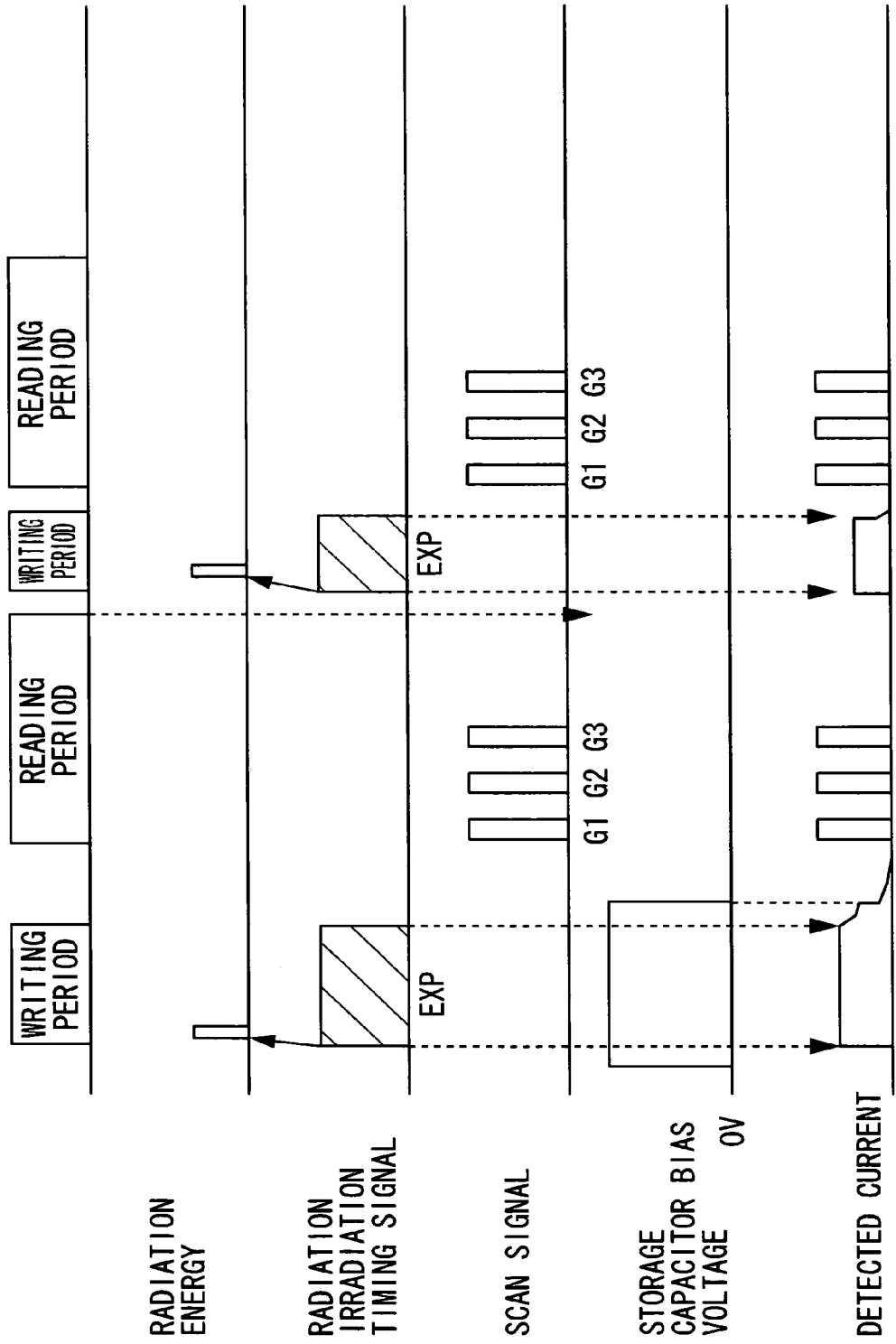

IMAGE DETECTION DEVICE AND METHOD OF DRIVING IMAGE DETECTOR

CROSS-REFERENCE TO RELATED APPLICATION

This application claims priority under 35 USC 119 from Japanese Patent Applications No. 2007-167114 and No. 2008-021612, the disclosures of which are incorporated by reference herein.

BACKGROUND OF THE INVENTION

1. Field of the Invention

The present invention relates to an image detection device having an image detector in which a large number of pixels having TFT switching elements are arrayed two-dimensionally, and to a method of driving an image detector.

2. Description of the Related Art

FPDs (flat panel detectors), in which an X-ray sensitive layer is disposed on a TFT active matrix array and which can directly convert X-ray information into digital data, have been put into practical use in recent years. As compared with a conventional imaging plate, an FPD has the advantages that an image can be confirmed promptly and moving images as well can be confirmed, and the spread of FPDs has advanced rapidly.

First, the structure of a conventional radiographic image detector will be described by using FIG. 15. FIG. 15 is a schematic equivalent circuit of 3×3 pixels. In FIG. 15, reference numeral 211 is an image sensor portion, 212 is a TFT switch, 213 is a charge storage capacitor, 214 are scan lines, 215 are data lines, and 216 are signal detectors.

Radiation such as X-rays or the like is incident on the image sensor portions 211, electron-hole pairs are generated, and the charges are accumulated in the storage capacitors 213 of the respective pixels. Thereafter, the TFT switches 212 are successively turned on by the scan lines 214, and the accumulated charges that are accumulated in the charge storage capacitors 213 are transferred to the data lines 215 that are connected to ones of the source/drain electrodes of the TFT switches 212, and are read by the signal detectors 216.

Such a radiographic image detector that is called an FPD has the feature that, because image signals can be detected directly, an accurate radiographic image is detected. However, there are cases in which, for any of various reasons, various types of noise are imparted to the image signal that is to be detected originally.

For example, leak current of a TFT switch is one type of noise. It is preferable that absolutely no leak current flow at the time of the off operation of the TFT switch for selecting the detection pixel. However, in light of the device characteristics, a given amount of leak current flows, and that amount is added to the image signal. In order to overcome this problem, Japanese Patent Application Laid-Open (JP-A) No. 2003-319264 for example proposes a method of reading out leak current at the time when a TFT switch is off, and correcting the image signal by using the leak current value.

However, the quality of the image does not necessarily improve with the method described in JP-A No. 2003-319264. The reason for this is because, in the method of JP-A No. 2003-319264, the processing of subtracting the leak current component from the image signal is used in correcting the leak current amount. Because the leak current component is random noise, even if the leak current component is subtracted from the image signal, the result is the addition value of the image signal and the leak current component, and the amount of noise increases. Further, there is the problem that there is the possibility that this will resultantly lead to a deterioration in image quality.

Further, the processing time required for the aforementioned leak correction also is an important problem. In medical diagnoses, because the photographing conditions must be optimized in accordance with the patient, the frequency of retaking images is high, and an image must be confirmed at a stage as soon as possible immediately after photographing. Further, X-ray detectors for moving images of course cannot take any more time than the frame rate. Moreover, the cost of peripheral circuits such as a memory and the like needed for correction processing is high, and when aiming to make the processing time faster, an even more expensive circuit system is needed.

SUMMARY OF THE INVENTION

In view of the aforementioned, an object of the present invention is to provide an image detection device and a method of driving an image detector that can suppress the above-described effects of leak current without the above-described deterioration in image quality, lengthening of the correction processing time, or increase in circuit costs.

A first aspect of the present invention is an image detection device including: an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor; a power source section connected so as to be able to apply voltage to the one electrode; and a control section that controls voltage applied from the power source section to the one electrode so as to promote the leak current through the switching element, for a predetermined time period before the charges accumulated in the storage capacitor are read out from the image detector.

The image detection device of the first aspect of the present invention controls the voltage that is applied to the one electrode so that it becomes easy for leak current to flow from the switching element, for a predetermined time period and before charges accumulated in the storage capacitor are read out from the image detector. Therefore, due to leak current flowing sufficiently before the charge signal is read out from the image detector, the leak current can be sufficiently reduced at the time of reading out of the charge signal. Thus, noise caused by leak current can be reduced.

In the image detection device of the first aspect of the present invention, the control section may control the voltage applied to the one electrode for the predetermined time period, during a time period from after electromagnetic waves for recording are irradiated onto the image detector up to before the charges are read out from the image detector.

The effects of leak current at the time of reading out the image can be made to be small by structuring the image detection device as described above, i.e., by, in the image detection device of the first aspect of the present invention, controlling the voltage that is applied to the one electrode such that it becomes easy for the leak current to flow from the switching element for the predetermined time period, during a time period from after the electromagnetic waves for recording are irradiated onto the image detector up to before the charges are read out from the image detector.

In the image detection device of the first aspect of the present invention, the control section may control the voltage that is applied to the one electrode for the predetermined time period that includes a period when the electromagnetic waves for recording are being irradiated onto the image detector.

By structuring the image detection device as described above, i.e., by controlling the voltage that is applied to the one electrode for the predetermined time period that includes a period when the electromagnetic waves for recording are being irradiated onto the image detector, the effects of leak current at the time of reading out the image can be made to be small, and further, the read-out timing of the image can be quickened.

The TFT switching element that the image detector has may have a function for protecting against voltage that protects the circuit due to current flowing when charges are accumulated in the storage capacitor and the potential of the other electrode becomes greater than or equal to a given value.

By structuring the image detection device as described above, i.e., by providing the TFT switching element with a function for protecting against voltage, the characteristic of the leak current becomes a characteristic such as shown in FIG. 6 which will be described later, and realization of the effects of the present invention is facilitated.

Further, the power source section may be provided at a peripheral circuit substrate that is provided separately from the image detector.

By structuring the image detection device as described above, i.e., by providing the power source section at a peripheral circuit substrate that is provided separately from the image detector, a power source having a large capacity, a large personal computer, and the like can be mounted, and the power source noise at the time of switching the voltage of the power source section can be made to be low.

The image detection device of the first aspect of the present invention may further comprise a signal detector that detects an accumulated charge amount by detecting a potential of a charge signal read out from the detection section of the image detector, and, at a time of detecting the potential of the charge signal, a potential of a reference electrode line, that is a reference of detection at the signal detector, and the potential of the one electrode structuring the storage capacitor, may be made to be a same potential level.

Leak current at the time of reading out the charge signal from the image detector can be reduced and detection noise can be reduced by structuring the image detection device as described above, i.e., by having the image detection device further include a signal detector that detects an accumulated charge amount by detecting a potential of a charge signal read out from the detection section of the image detector, and, at a time of detecting the potential of the charge signal, making the potential of the reference electrode line, that is the reference of detection at the signal detector, and the potential of the one electrode structuring the storage capacitor, be the same level. Namely, for example, in a case in which the potential of the reference electrode line of the signal detector and the potential of the one electrode are offset from one another, e.g., in a case in which the potential of the one electrode is high, uniform current always flows from the one electrode side to the signal detector side. Namely, originally, when the charge amount accumulated in the storage capacitor finishes flowing, the current from the detection section to the signal detector disappears. However, due to the above-described phenomenon, leak current at the time of detection (constant current due to the difference between the potential of the reference electrode line of the signal detector and the potential of the one electrode) is added, and due thereto, white noise (noise of a constant level) arises. Accordingly, if the potential of the reference electrode line of the signal detector and the potential of the one electrode are made to be the same level as described above, the aforementioned white noise can be reduced.

In the image detection device of the first aspect of the present invention, it is preferable that the predetermined time period is from 100 μs to 1 s.

If the predetermined time period is made to be from 100 μs to 1 s, leak current from the switching element can be made to flow sufficiently, without deteriorating the operational efficiency.

An image detection device of a second aspect of the present invention includes: an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor; and a voltage application circuit applying a controlled voltage to the one electrode, so as to vary leak current from the switching element.

The image detection device of the second aspect of the present invention is provided with the voltage application circuit that varies the leak current from the switching element of the image detector. Therefore, the leak current from the switching element can be controlled as will be described later, and, due to the leak current flowing sufficiently before the charge signal is read out from the image detector, the leak current can be sufficiently reduced at the time of reading out of the charge signal. Thus, noise caused by leak current can be reduced.

A third aspect of the present invention is a method of driving an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor, the method including: generating electromagnetic waves for recording, and irradiating the electromagnetic waves onto the charge generation section; for a predetermined time period before a point in time of reading out the charges from the storage capacitor via the switching element, varying a voltage applied to the one electrode so as to promote leak current through the switching element; and operating the switching element and detecting the charges accumulated in the storage capacitor.

In accordance with the driving method of an image detector of the third aspect of the present invention, at a timing before the point in time of reading out the charges from the storage capacitor via the switching element of the image detector, the voltage applied to the one electrode is varied such that it becomes easy for leak current to flow from the switching element. Therefore, the leak current from the switching element can be controlled as will be described later, and, due to the leak current flowing sufficiently before the charge signal is read out from the image detector, the leak current can be sufficiently reduced at the time of reading out of the charge signal. Thus, noise caused by leak current can be reduced.

BRIEF DESCRIPTION OF THE DRAWINGS

FIG. 13B is a drawing for explaining leak currents of TFT switches in a case in which there are protecting diodes;

FIG. 14 is a drawing for explaining leak currents of TFT switches in a case in which an embodiment of the method of driving an image detector of the present invention is implemented;

FIG. 18 is a timing chart for explaining an embodiment of the method of driving an image detector at the time of two-shot energy subtraction photographing.

DETAILED DESCRIPTION OF THE INVENTION

A case in which the present invention is applied to a radiographic image detecting system will be described hereinafter with reference to the drawings.

Figure 1:
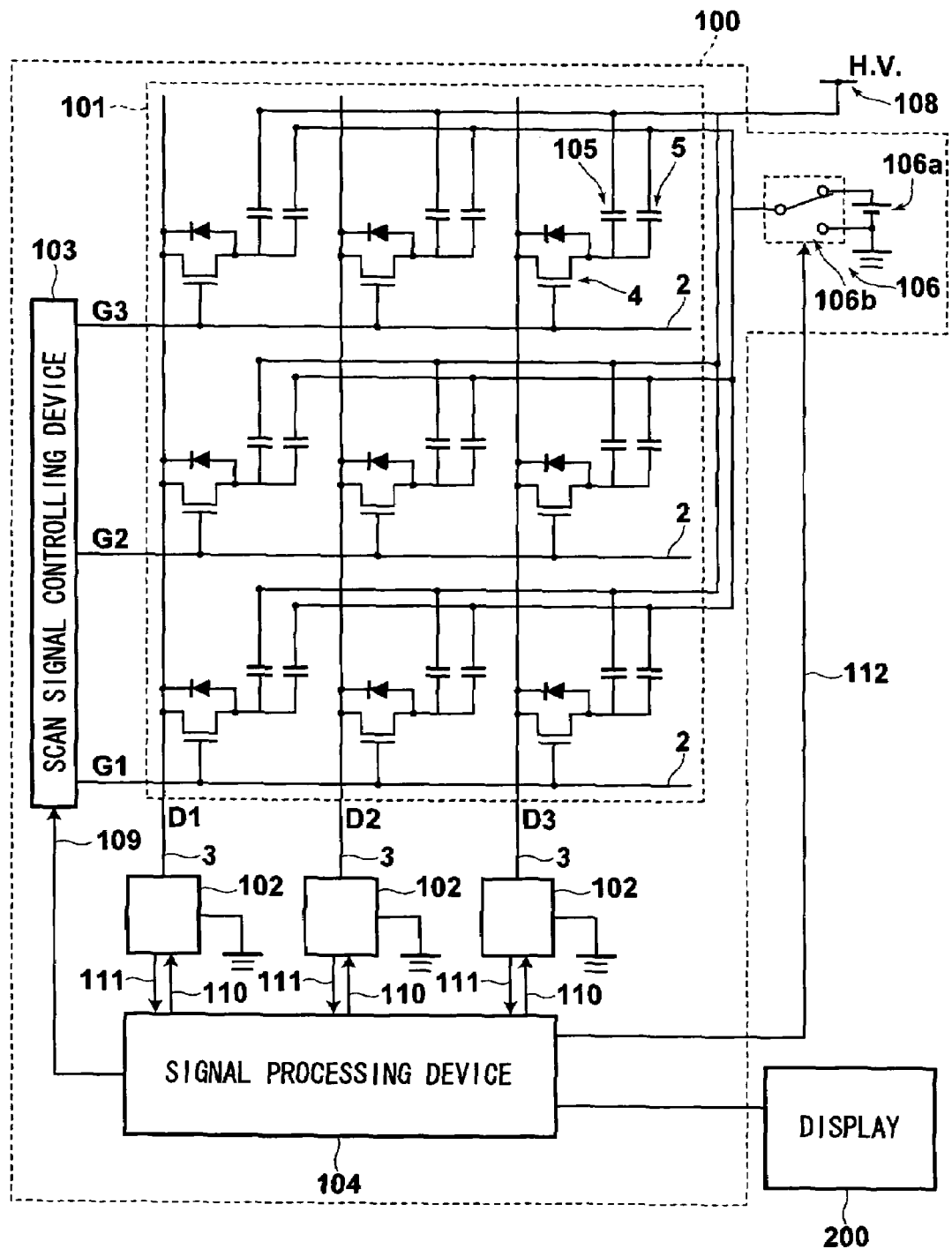
FIG. 1 is a schematic structural diagram of a radiographic image detecting system to which a first exemplary embodiment of an image detection device of the present invention is applied.

FIG. 1 is a schematic structural drawing of a radiographic image detecting system relating to a first exemplary embodiment.

As shown in FIG. 1, the present radiographic image detecting system has a radiographic image detection device 100 that reads-out radiographic image signals from a radiographic image detector, and a display 200 that displays a radiographic image on the basis of the radiographic image signals read out by the radiographic image detection device 100.

The radiographic image detection device 100 has: a radiographic image detector 101; signal detectors 102 detecting radiographic image signals outputted from the radiographic image detector 101; a scan signal controlling device 103 outputting scan signals to scan lines of the radiographic image detector 101; and a signal processing device 104 that acquires detection signals detected by the signal detectors 102 and outputs them as video signals to the display 200, and further, outputs control signals to the scan signal controlling device 103, the signal detectors 102 and a power source section 106 that will be described later.

The radiographic image detector 101 is configured such that a large number of pixels are arrayed in a two-dimensional form. The pixel is configured from: an image sensor portion 105 that is configured from a bias electrode, a semiconductor film and a charge collecting electrode that will be described later; a charge storage capacitor 5 that accumulates the charge signal detected at the image sensor portion 105; and a TFT switch 4 for reading out the charges accumulated in the charge storage capacitor 5. Further, a large number of scan lines 2 for turning the TFT switches 4 on/off, and a large number of data lines 3 through which the charges accumulated in the charge storage capacitors 5 are read out, are provided.

The signal processing device 104 and the scan signal controlling device 103 are connected by a scan control signal line 109. Control signals are outputted from the signal processing device 104 to the scan signal controlling device 103 via this scan control signal line 109.

The signal processing device 104 and the signal detectors 102 are connected by control lines 110 and signal lines 111. Control signals are outputted from the signal processing device 104 to the signal detectors 102 via the control lines 110. Signals that are detected at the signal detectors 102 are outputted from the signal detectors 102 to the signal processing device 104 via the signal lines 111.

The radiographic image detection device 100 has the variable Cs power source 106 that changes, for a predetermined time period, the potential of charge storage capacitor electrodes 14 that will be described later and that structure the charge storage capacitors 5 of the respective pixels of the radiographic image detector 101. Note that the variable Cs power source 106 is provided on a peripheral substrate that is different from and separate from the radiographic image detector 101.

In the present exemplary embodiment, the variable Cs power source 106 is configured from a DC voltage source 106a and a switch 106b, as shown in FIG. 1. By switching the switch 106b, the charge storage capacitors 5, and GND (ground) or the DC power source 106a, are connected, and the potentials of the charge storage capacitor electrodes 14 structuring the charge storage capacitors 5 are changed for a predetermined time period.

The variable Cs power source 106 and the signal processing device 104 are connected by a Cs power source control line 112. A control signal, that switches the switch 106b of the variable Cs power source 106, is outputted from the signal processing device 104 to the Cs power source control line 112.

The present radiographic image detecting system is provided with a high voltage power source 108 that applies high voltage to bias electrodes, which will be described later, of the image sensor portions 105 at the time of recording a radiographic image onto the radiographic image detector 101. Note that, although the high voltage power source 108 is provided separately from the radiographic image detection device 100 in the present radiographic image detecting system, the high voltage power source 108 may be included in the radiographic image detection device 100. Further, "high voltage" here means voltage that is greater than or equal to about 500 V.

Figure 2:
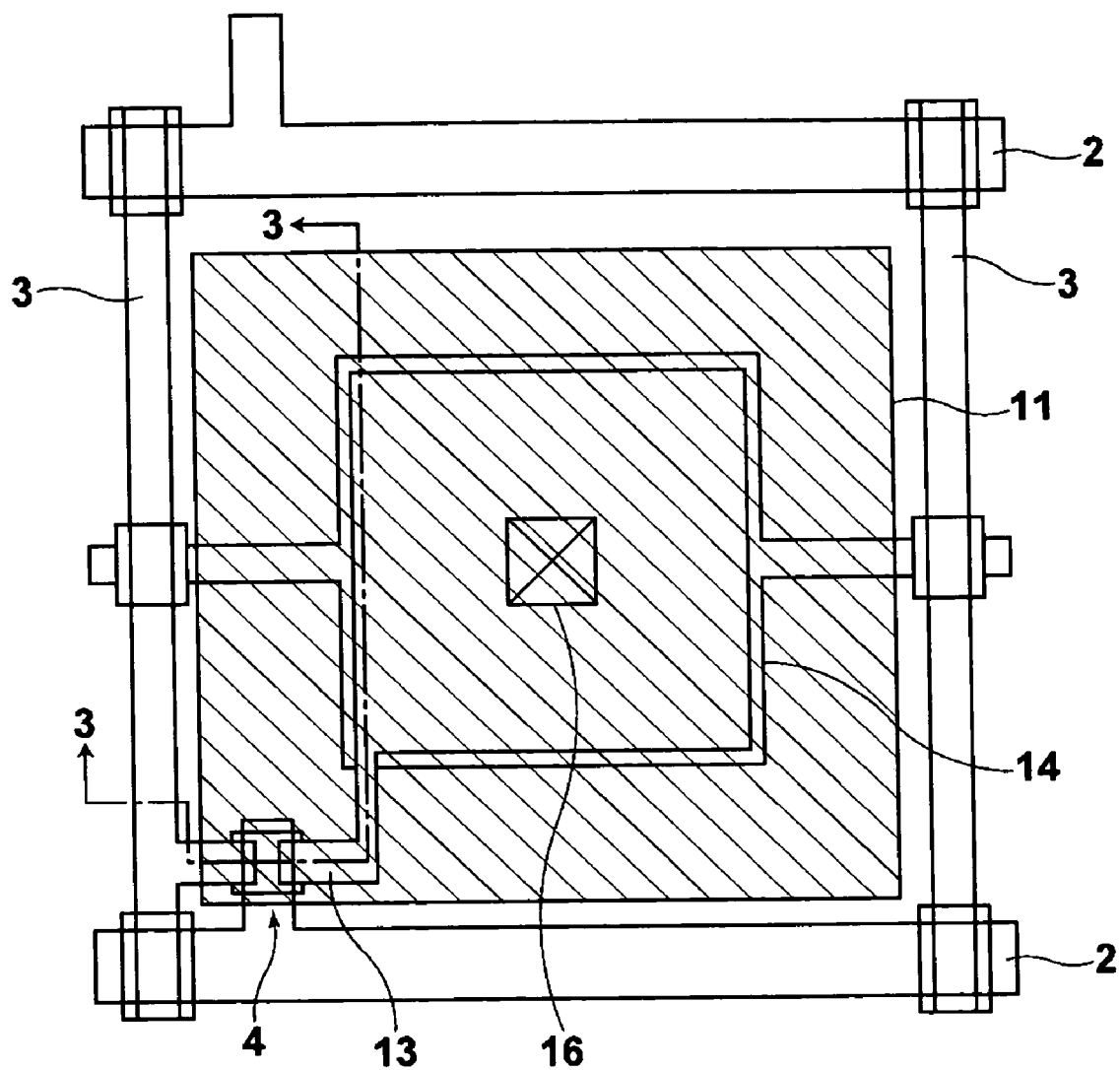
FIG. 2 is a plan view showing the structure of one pixel unit of a radiographic image detector.

The radiographic image detector 101 will be described in further detail. FIG. 2 is a plan view showing the structure of one pixel unit of the radiographic image detector 101, and FIG. 3 is a cross-sectional view along line 3-3 of FIG. 2.

Figure 3:
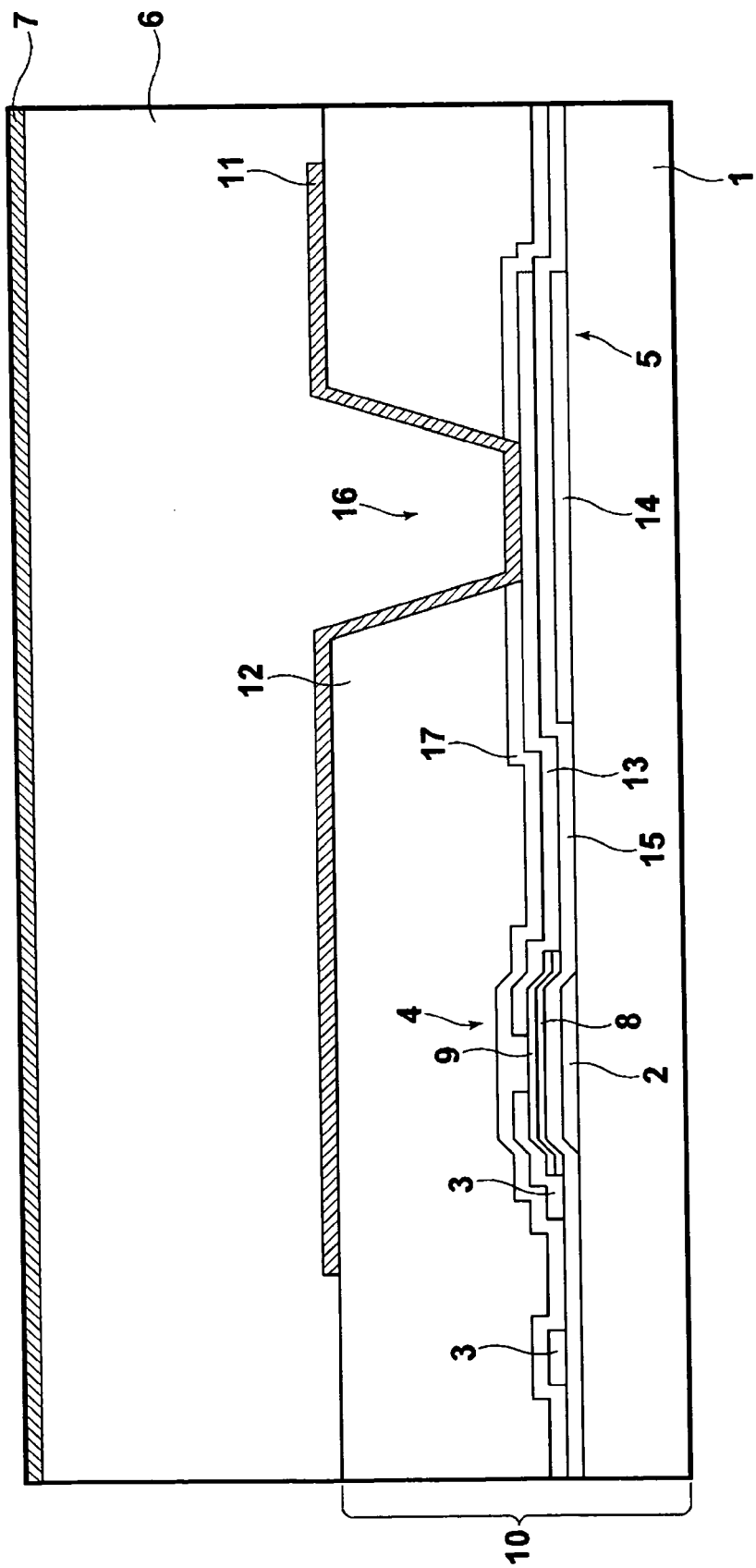
FIG. 3 is a cross-sectional view showing the structure of one pixel unit of the radiographic image detector.

As shown in FIG. 3, at the radiographic image detector 101, a semiconductor film 6 that is electromagnetic-wave-conductive, and a bias electrode 7 that is connected to the high voltage power source 108, are formed successively on an active matrix substrate 10. The semiconductor film 6 generates charges (electrons-holes) at the interior thereof due to the irradiation of electromagnetic waves such as X-rays or the like thereon. Namely, the semiconductor film 6 is electromagnetic-wave-conductive, and is for converting the image information by the X-rays into charge information. Further, the semiconductor film 6 is formed from, for example, amorphous a-Se (amorphous selenium) whose main component is selenium. Here, "main component" means having a content of greater that or equal to 50%.

The active matrix substrate 10 will be described in detail hereinafter.

The active matrix substrate 10 has a glass substrate 1, the scan line 2, the charge storage capacitor electrode (hereinafter called $C_S$ electrode) 14, a gate insulating film 15, a connection electrode 13, a channel layer 8, a contact layer 9, the data line 3, an insulating protective film 17, an interlayer insulating film 12, and a charge collecting electrode 11.

A thin film transistor (TFT) 4 is configured by the scan line 2, the gate insulating film 15, the data line 3, the connection electrode 13, the channel layer 8, the contact layer 9, and the like. The charge storage capacitor ($C_S$) 5 is configured by the $C_S$ electrode 14, the gate insulating film 15, the connection electrode 13, and the like.

The glass substrate 1 is a supporting substrate. For example, an alkaline-free glass substrate (e.g., #1737 manufactured by Corning Incorporated, or the like) can be used as the glass substrate 1. As shown in FIG. 1, the scan lines 2 and the data lines 3 are electrode lines that are arrayed in the form of a grid, and the thin film transistors (hereinafter called TFT switches) 4 are formed at the points of intersection thereof. The TFT switch 4 is a switching element, and the source and drain thereof are connected to the data line 3 and the connection electrode 13, respectively. The data line 3 is the source electrode thereof, and the connection electrode 13 is the drain electrode thereof. Namely, the data line 3 has a rectilinear portion serving as a signal line, and an extended portion for structuring the TFT switch 4. The connection electrode 13 is provided so as to connect the TFT switch 4 and the charge storage capacitor 5.

The gate insulating film 15 is formed of $SiN_X$, $SiO_X$, or the like. The gate insulating film 15 is provided so as to cover the scan line 2 and the $C_S$ electrode 14. The region of the gate insulating film 15 that is positioned above the scan line 2 functions as a gate insulating film at the TFT switch 4, and the region positioned above the $C_S$ electrode 14 functions as a dielectric layer at the charge storage capacitor 5. Namely, the charge storage capacitor 5 is configured by the superposed region of the connection electrode 13 and the $C_S$ electrode 14 that is formed at the same layer as the scan line 2. Note that the gate insulating film 15 is not limited to $SiN_X$ or $SiO_X$, and can be used together with an anodized oxide film formed by anodically oxidizing the scan line 2 and the $C_S$ electrode 14.

The channel layer (i layer) 8 is the channel portion of the TFT switch 4, and is a current path that connects the data line 3 and the connection electrode 13. The contact layer ($n^+$ layer) 9 connects the data line 3 with the connection electrode 13.

The insulating protective film 17 is formed on the data line 3 and the connection electrode 13, i.e., is formed on the glass substrate 1, over substantially the entire surface (substantially the entire region). In this way, the insulating protective film 17 protects the connection electrode 13 and the data line 3, and electrically insulates and separates them. Further, the insulating protective film 17 has a contact hole 16 at a predetermined position thereof, i.e., a region that is positioned on the portion of the connection electrode 13 facing the $C_S$ electrode 14 via the gate insulating film 15.

The charge collecting electrode 11 is formed from an amorphous, transparent, electrically-conductive oxide film. The charge collecting electrode 11 is formed so as to fill-in the contact hole 16, and is layered above the data line 3 and above the connection electrode 13. The charge collecting electrode 11 and the semiconductor film 6 are electrically conductive, and the charges generated at the semiconductor film 6 can be collected at the charge collecting electrode 11.

The interlayer insulating film 12 is formed from an alkaline resin that is photosensitive, and electrically isolates and separates the TFT switch 4. The contact hole 16 passes-through the interlayer insulating film 12 such that the charge collecting electrode 11 is connected to the connection electrode 13.

The scan line 2 and the $C_S$ electrode 14 are provided on the glass substrate 1. The channel layer (i layer) 8 and the contact layer ($n^+$ layer) 9 are formed in that order above the scan line 2 via the gate insulating film 15. The data line 3 and the connection electrode 13 are formed on the contact layer 9. The connection electrode 13 is layered above the layer that structures the charge storage capacitor 5.

The interlayer insulating film 12 of the TFT switch 4 is provided on the insulating protective film 17. The charge collecting electrode 11 is provided at the upper layer of the interlayer insulating film 12, i.e., at the uppermost layer of the active matrix substrate 10. The charge collecting electrode 11 and the TFT switch 4 are connected via the connection electrode 13.

Further, the gate insulating film 15 is disposed above the $C_S$ electrode 14, and the connection electrode 13 is disposed above the gate insulating film 15.

The high voltage power source 108 (see FIG. 1) is connected to the bias electrode 7. Voltage is applied to the bias electrode 7 from the high voltage power source 108. In this way, an electric field is generated between the bias electrode 7 and the charge collecting electrode 11, via the charge storage capacitor 5. At this time, because the semiconductor film 6 and the charge storage capacitor 5 are configured so as to be electrically connected in series, when radiation that has passed through the subject of photographing is irradiated from the bias electrode 7 side in a state in which bias voltage is applied to the bias electrode 7, charges (electron-hole pairs) are generated within the semiconductor film 6. The electrons generated at the semiconductor film 6 move toward the positive electrode side, the holes move toward the negative electrode side, and as a result, charges are accumulated in the charge storage capacitor 5.

At the radiographic image detector on the whole, a plurality of the charge collecting electrodes 11 are arrayed two-dimensionally, and the radiographic image detector is provided with a plurality of the charge storage capacitors 5, which are individually connected to the charge collecting electrodes 11, and a plurality of the TFT switches 4, which are individually connected to the charge storage capacitors 5. In this way, two-dimensional charge information can be read out easily by two-dimensional electromagnetic wave information being accumulated in the charge storage capacitors 5 once and the TFT switches 4 being scanned successively.

Figure 4:
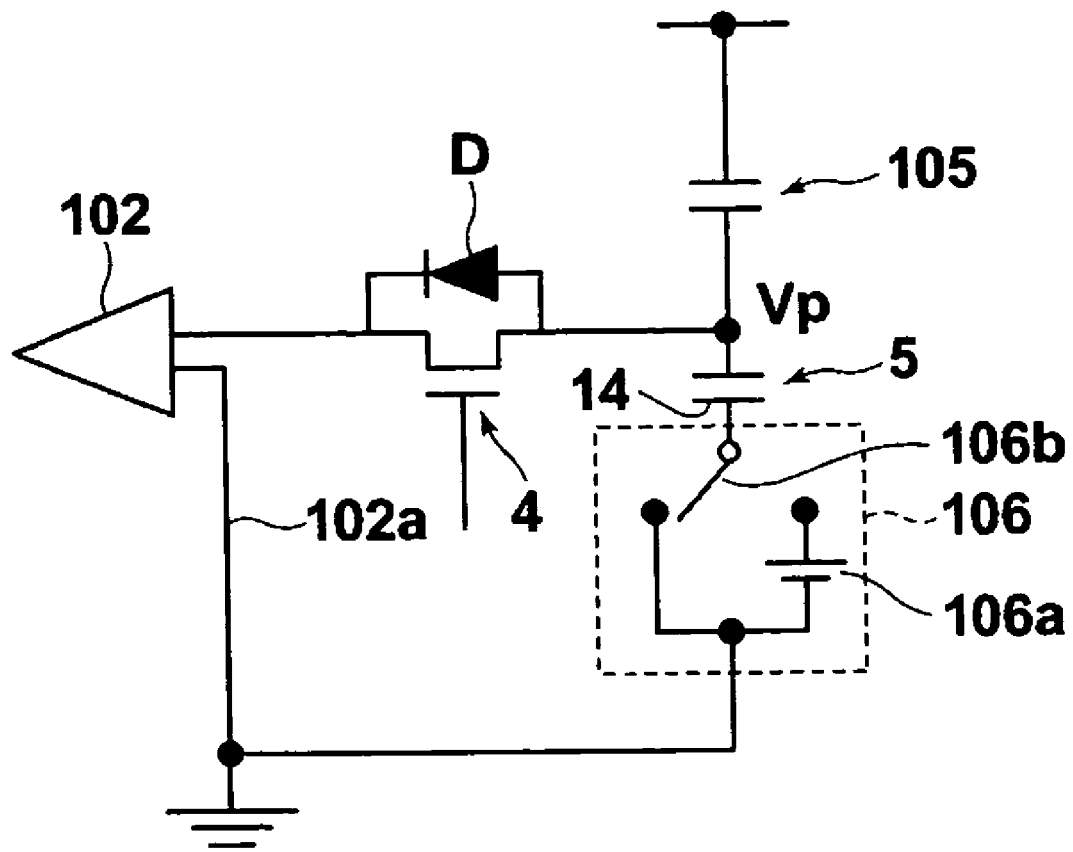
FIG. 4 is an equivalent circuit diagram of one pixel unit of the radiographic image detector.

A TFT protecting circuit will be described next by using the equivalent circuit of one pixel of the radiographic image detector shown in FIG. 4.

As described above, in the present exemplary embodiment, the charge collecting electrode 11 is disposed so as to overlap the channel portion (the portion formed from the channel layer 8 and the contact layer 9) of the TFT switch 4, via the insulating protective film 17 and the interlayer insulating film 12. With such a structure, the charge collecting electrode 11 functions as a second gate electrode with respect to the TFT switch 4, and the amount of current that flows to the TFT channel 4 can be controlled by the potential of the charge collecting electrode 11.

Here, because the charge collecting electrode 11 is connected to the drain electrode (the connection electrode 13) of the TFT switch 4 via the contact hole 16, the charge collecting electrode 11 functions as a diode. Accordingly, as an equivalent circuit, there is a structure in which a diode D is disposed in parallel to the TFT switch 4 as shown in FIG. 4.

When radiation is irradiated onto the semiconductor layer 6 and charges are generated, and the charges collect at the charge collecting electrode 11 and a potential Vp of the charge collecting electrode 11 becomes greater than or equal to a given value, the diode D turns on and the charges accumulated in the charge storage capacitor 5 flow to the data line 3. In this way, also in cases in which a large amount of charge is generated due to the irradiation of radiation, the charges flow through the diode D to the data line 3 and the potential Vp of the charge collecting electrode 11 can be lowered, before the TFT switch 4 or the charge storage capacitor 5 electrostatically breaks.

Figure 5:
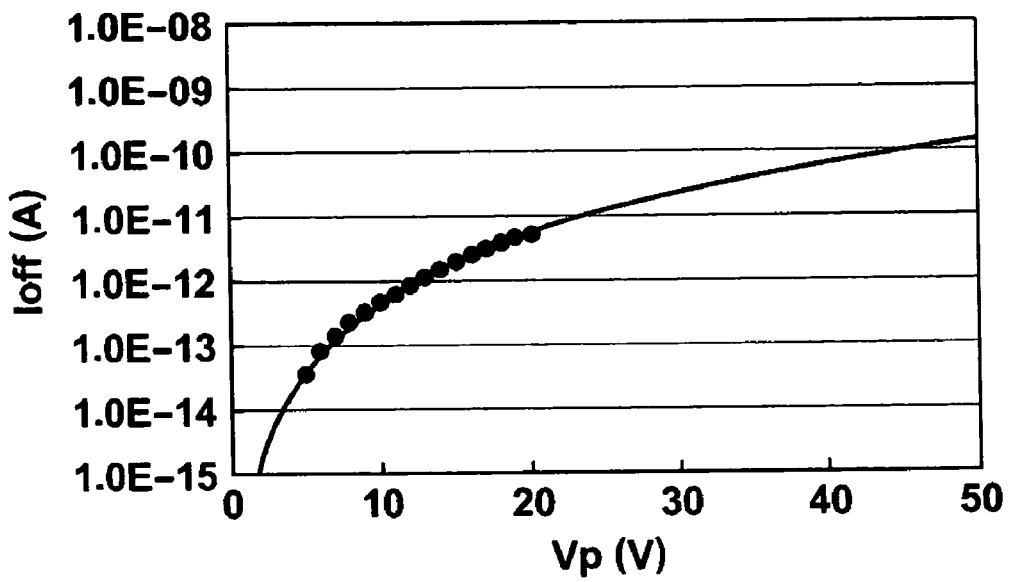
FIG. 5 is a drawing showing a leak current characteristic of a TFT switch in a case in which there is no TFT protecting circuit.
Figure 6:
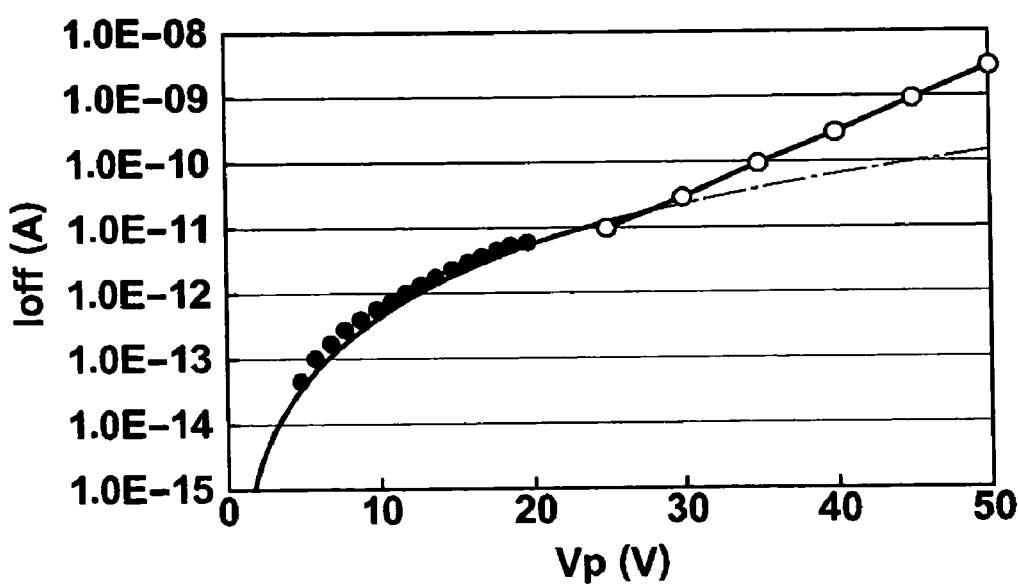
FIG. 6 is a drawing showing a leak current characteristic of a TFT switch in a case in which there is a TFT protecting circuit.

Next, the leak current characteristic of the TFT switch 4 in a case in which a TFT protecting circuit such as described above is not provided at the TFT switch 4, and the leak current characteristic of the TFT switch 4 in a case in which a TFT protecting circuit is provided, will be described. In the case in which the TFT switch 4 does not have a TFT protecting circuit, as shown in FIG. 5, leak current Ioff of the TFT switch 4 increases monotonically by power approximation of the potential Vp of the charge collecting electrode. On the other hand, in the case in which the TFT switch 4 has a TFT protecting circuit, as shown in FIG. 6, when the potential Vp of the charge collecting electrode exceeds a given voltage (here, around 30 V), the diode that is the TFT protecting circuit functions, and the leak current increases exponentially. In this way, as compared with a case in which there is no TFT protecting circuit, a large amount of leak current can flow, and as a result, it is easy to prevent electrostatic breakage of the TFT switch and the charge storage capacitor.

Figure 7:
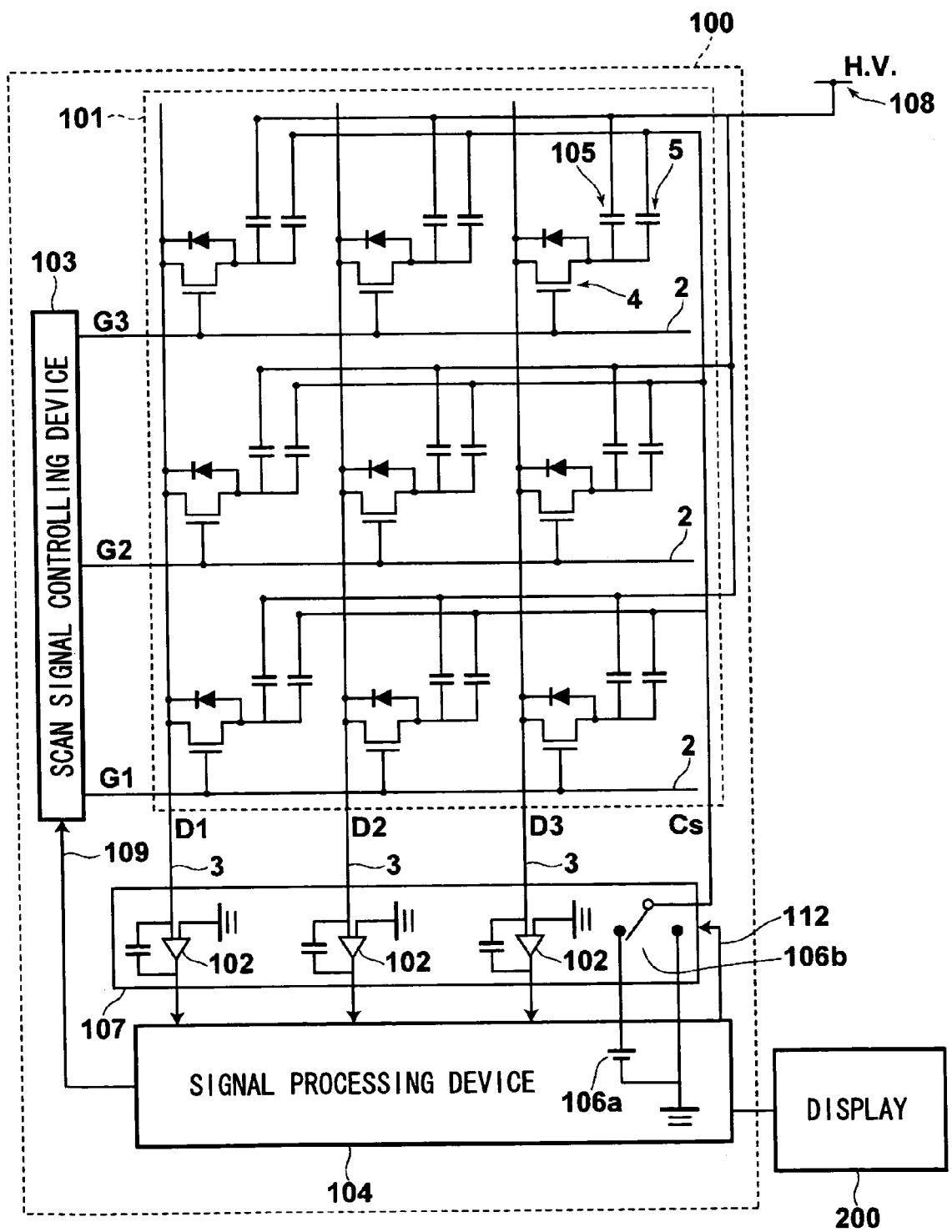
FIG. 7 is a drawing showing another structural example of a variable Cs power source.

Further, in the present exemplary embodiment, the variable Cs power source 106 is provided as shown in FIG. 1. However, as shown in FIG. 7, it is possible to provide only the DC power source 106a of the variable Cs power source 106 at the signal processing device 104, and to incorporate the switch 106b of the variable Cs power source 106 in an amp IC 107 that is equipped with a large number of the signal detectors (amps) 102. By incorporating the switch 106b in the amp IC 107, the distance between the switch 106b and the radiographic image detector 101 can be shortened, and noise generated by routing wires can be reduced. Further, by incorporating the switch 106b in the amp IC 107, a switch on the peripheral circuit substrate becomes unnecessary, the surface area of the peripheral circuit can be reduced, and compactness is possible. Note that the signal processing device 104 and the amp IC 107 are connected by the Cs power source control line 112, and the control signal that switches the switch 106b of the variable Cs power source 106 is outputted from the signal processing device 104 to the Cs power source control line 112.

Figure 8:
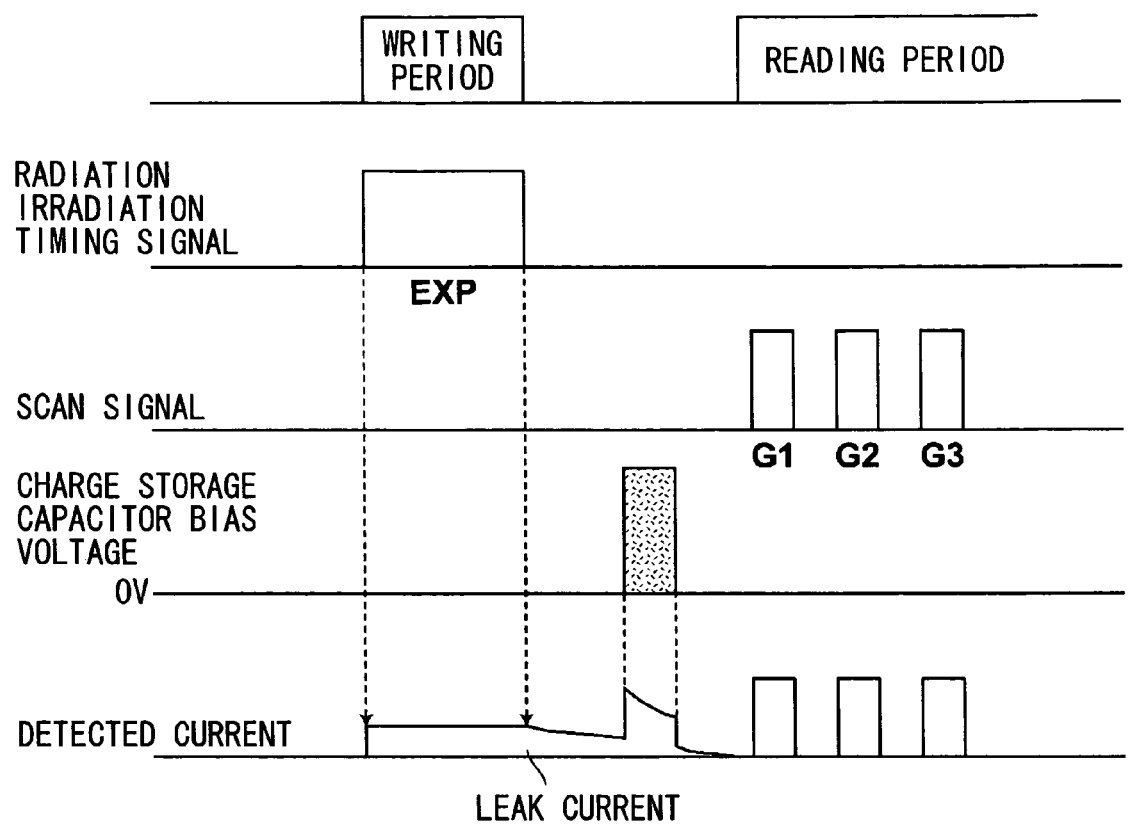
FIG. 8 is a timing chart for explaining an embodiment of a method of driving an image detector relating to the first exemplary embodiment of the present invention.

A method of driving a radiographic image detector in order to reduce TFT leak current, which is a feature of the present invention, will be explained next by using FIG. 8. FIG. 8 shows a timing signal of the irradiation of radiation onto the radiographic image detector 101, a scan signal that controls the on/off of the TFT switch 4 and is outputted from the scan signal controlling device 103, bias voltage that is applied to the charge storage capacitor 5 by the variable Cs power source 106, and detected current detected by the signal detector 102.

First, in the writing period, radiation is irradiated onto the radiographic image detector 101. In this writing period, the Cs electrode 14 that structures the charge storage capacitor is maintained at the same potential as GND. Then, during the writing period, the potential Vp of the charge collecting electrode 11 increases depending on the irradiated radiation amount. For example, when Vp becomes 25 V, from FIG. 6, leak current of around 10 pA flows-out to the data line 3 via the TFT switch 14.

Then, as shown in FIG. 8, leak current flows also after the writing period has ended. However, because the potential Vp of the charge collecting electrode falls in conjunction with the leak, the leak current gradually decreases in accordance with time. Then, in the present exemplary embodiment, in order to decrease the leak current that flows slowly, during the period of time from after the end of the writing period up to the reading period, a Cs power source switching signal is outputted from the signal processing device 104 to the variable Cs power source 106. The switch 106b of the variable Cs power source is switched in accordance with this signal, a potential Vcs of the Cs electrode 14 of the charge storage capacitor 5 is boosted by the variable Cs power source 106, and the potential Vp of the charge collecting electrode is thereby maintained high for a given time period. Note that "boosting" here means that the voltage applied to the Cs electrode 14 is made to be a high potential of greater than or equal to a predetermined value. Further, this predetermined value is preferably set to a voltage value that is greater than or equal to the inflection point of the leak current characteristic shown in FIG. 6 (the point where the diode that is the TFT protecting circuit functions and the leak current starts to increase exponentially).

For example, in a case in which Vp becomes 10 V higher and becomes 35 V due to Vcs, leak current of 100 pA flows to the data line. The aforementioned voltage maintaining period is preferably ensured until charges sufficiently flow-out from the TFT switch 4 and Vp becomes around 30 to 25 V. In terms of time, the voltage maintaining period is preferable set to between 100 μs to 1 s, and more preferably, is around 100 ms. If the voltage maintaining period is too short, leak current cannot sufficiently flow, whereas if the voltage maintaining period is too long, the point in time when reading starts becomes that much later and operational efficiency deteriorates.

After voltage is applied to the charge storage capacitor 5 as described above, when the Cs electrode 14 of the charge storage capacitor 5 is connected to GND and Vcs is returned to its original value, Vp decreases 10 V, and therefore becomes around 15 to 20 V. The leak current at this time falls to around several pA. By varying the voltage Vcs that is applied to the Cs electrode 14 of the charge storage capacitor 5 in this way, the leak current can be reduced.

Next, a scan signal is outputted from the scan signal controlling device 103 to scan lines G1, G2, G3 successively. The TFT switches 4 connected to the scan lines G1, G2, G3 are successively turned on, and the charges accumulated in the charge storage capacitors 5 flow-out to the data lines 3. The charges that flow-out to the data lines 3 are detected by the signal detectors 102 and reading is carried out.

Figure 10:
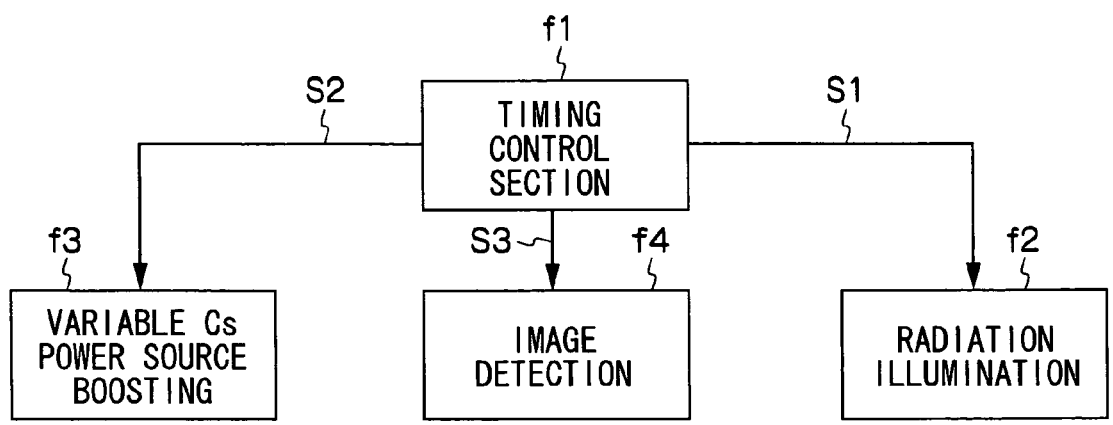
FIG. 10 is a functional block diagram of the radiographic image detecting system shown in FIG. 1.

A functional block diagram for carrying out control of operations at timings such as shown in FIG. 8 is shown in FIG. 10. The timings of the boosting of the $C_S$ electrode 14, the image detection (image reading), and the irradiation of radiation are controlled so as to be carried out at timings such as shown in FIG. 8.

Concretely, a timing control section f1 that is included in the signal processing device 104 carries out control of operations such as shown in FIG. 8. In the case of carrying out image detection, first, a control signal S1 is outputted from the timing control section f1 to an unillustrated radiation source, and the timing of radiation irradiation f2 from the radiation source onto the radiographic image detector 101 is controlled by this control signal S1.

Next, a control signal S2 is outputted from the timing control section f1 to the variable Cs power source 106 via the Cs power source control line 112. The switch 106b of the variable Cs power source 106 is switched to the DC power source 106a side, and the timing of variable Cs power source boosting f3 is controlled.

Then, after the variable Cs power source boosting f3, a control signal S3 is outputted from the timing control section f1 to the scan signal controlling device 103, the signal detectors 102, and the like. The timing of detection f4 of the image recorded at the radiographic image detector 101 is controlled in accordance with this control signal S3.

Note that the timing control section f1 can be realized, for example, by a program that is executed by a computing device such as a CPU, a DSP, or the like that is included in the signal processing device 104.

In accordance with the driving method of the present exemplary embodiment, as described above, leak current flows sufficiently before the image data reading period, and the leak current is reduced sufficiently by the time of the image data reading period, and thereafter, image data reading is carried out. Therefore, effects of leak current during the reading period can be suppressed. Note that, during the reading period, the potentials of reference electrode lines 102a (see FIG. 4) of the signal detectors 102 and the potentials of the Cs electrodes 14 that structure the charge storage capacitors 5 are made to be the same level. In a case in which the pixels of the radiographic image detector are configured such as shown in FIG. 4, the potentials of the reference electrode lines 102a of the signal detectors 102 and the potentials of the Cs electrodes 14 structuring the charge storage capacitors 5 are GND. GND can be stabilized by connecting the reference electrode lines 102a and the Cs electrodes 14 as described above.

Figure 9:
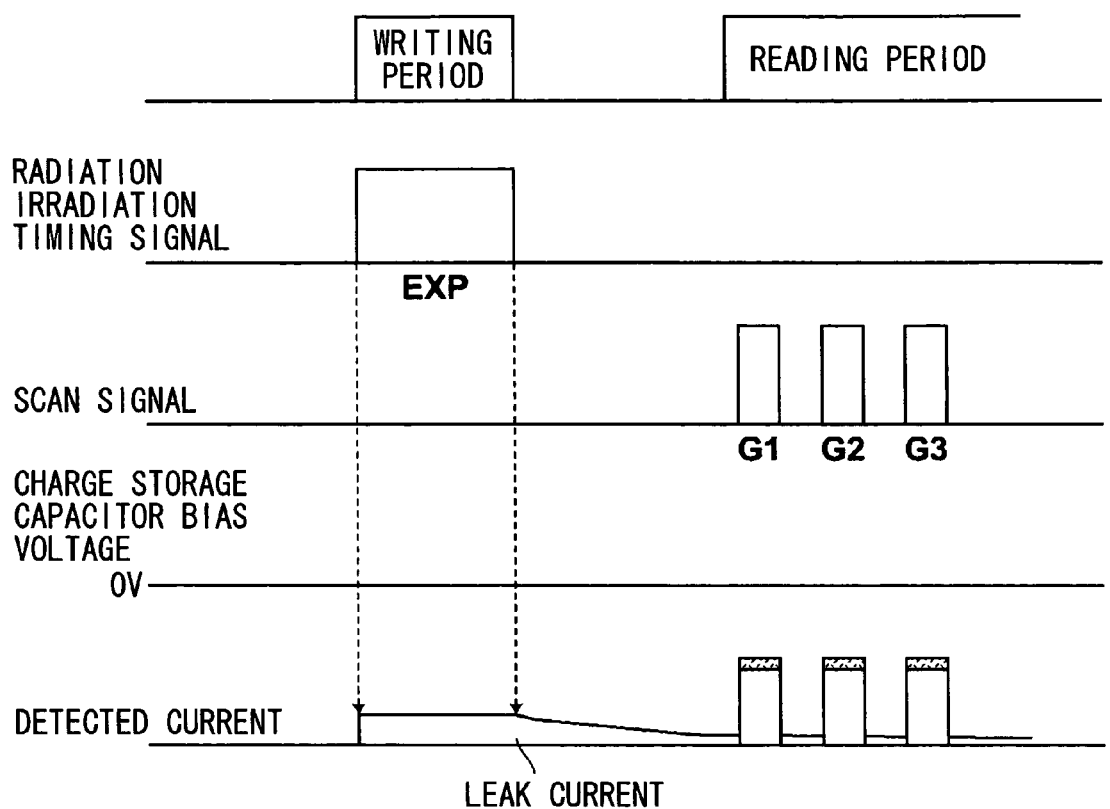
FIG. 9 is a drawing for explaining a conventional method of driving a radiographic image detector.

For comparison, a conventional method of driving a radiographic image detector is shown in FIG. 9.

First, in the writing period, radiation is irradiated onto the radiographic image detector. In this writing period, the Cs electrode 14 that structures the charge storage capacitor is maintained at the same potential as GND. Then, during the writing period, the potential Vp of the charge collecting electrode 11 increases depending on the irradiated radiation amount. The charges, that have become excess due to the potential of the charge collecting electrode 11 rising, leak via the TFT switch 4. Due thereto, the potential Vp of the charge collecting electrode 11 decreases, and therefore, the leak current also gradually decreases. However, as shown in FIG. 9, a long time is required as compared with the method of driving a radiographic image detector of the present invention.

Next, a scan signal from the scan signal controlling device 103 is outputted to the scan lines G1, G2, G3 successively. The TFT switches 4 connected to the scan lines G1, G2, G3 are successively turned on. The charges accumulated in the charge storage capacitors 5 flow-out to the data lines 3. The charges that flow-out to the data lines 3 are detected by the signal detectors 102 and reading is carried out. However, in this conventional driving method, as described above, a long time is required in order for the leak current to decrease. Therefore, charges of an amount corresponding to the leak current are added in the reading period of the image data, and it is easy for a false image (artifact) that is not the written data to arise.

Note that, in the radiographic image detector of the above-described exemplary embodiment, the TFT protecting circuit is provided at the TFT switch 4 as described above. However, the TFT protecting circuit does not necessarily have to be provided. The effect of reducing the leak current can be obtained even by merely applying voltage to the charge storage capacitor for a predetermined time period as described above.

Further, in the radiographic image detection device of the above-described exemplary embodiment, positive voltage is applied to the charge storage capacitor. However, in a case in which the radiographic image detector has negative bias, it suffices to apply negative voltage. Namely, it suffices to apply voltage in the direction in which the leak current from the TFT switch 4 increases.

A radiographic image detecting system relating to a second exemplary embodiment will be described next.

The schematic structure of the radiographic image detecting system relating to the second exemplary embodiment is similar to that of the radiographic image detecting system of the first exemplary embodiment shown in FIG. 1. However, the structure of the variable Cs power source in the radiographic image detection device differs from that of the first exemplary embodiment.

Figure 11:
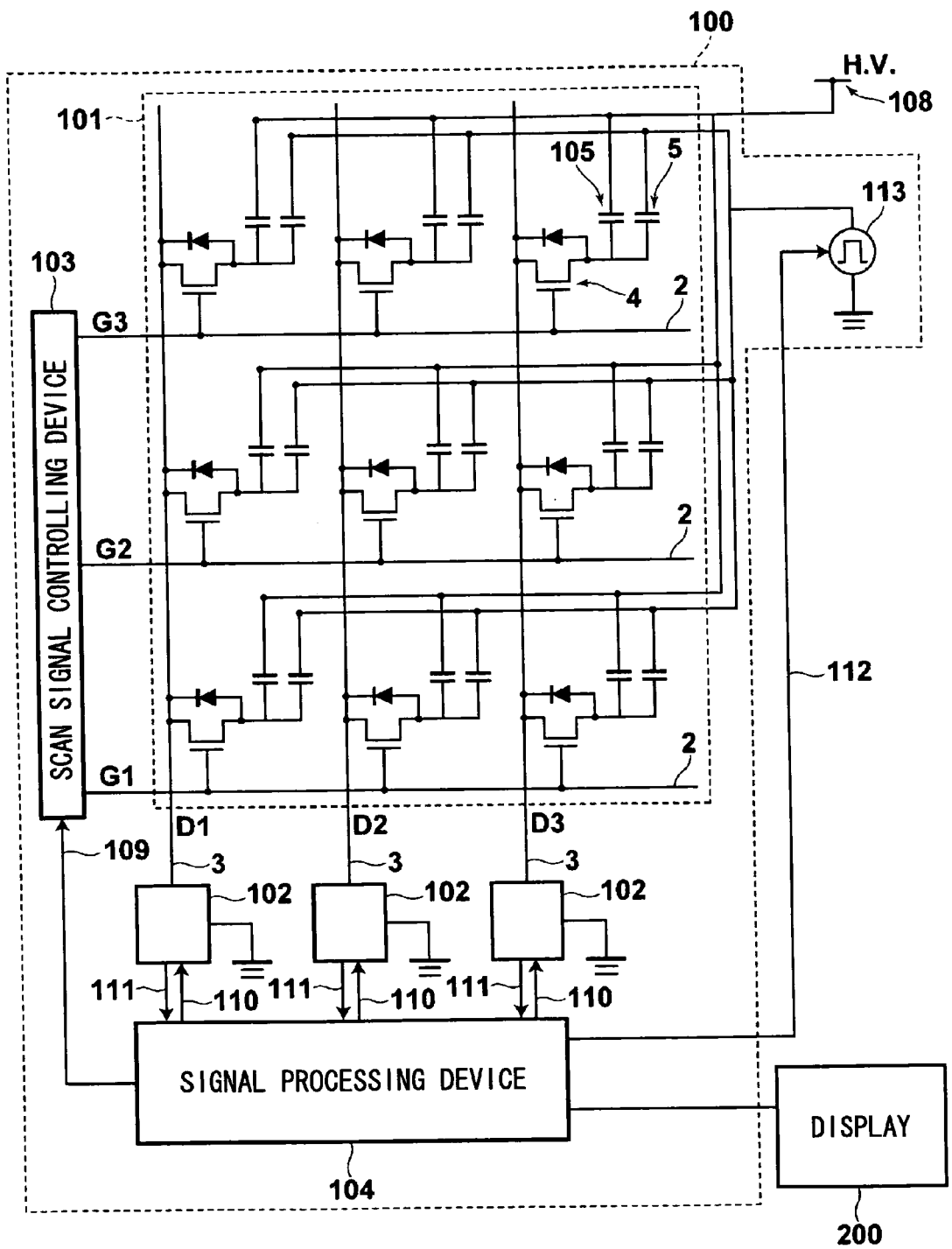
FIG. 11 is a schematic structural diagram of a radiographic image detecting system to which is applied a second exemplary embodiment of the image detection device of the present invention.

As shown in FIG. 11, a variable Cs power source 113 in the radiographic image detection device of the second exemplary embodiment outputs a rectangular-wave-shaped voltage. Further, a control signal is outputted from the signal processing device 104 to the variable Cs power source 113, and, in accordance with this control signal, a rectangular-wave-shaped voltage is outputted from the variable Cs power source 113 at a timing such as shown in FIG. 8. Note that, in the present exemplary embodiment, a rectangular-wave-shaped voltage is outputted from the variable Cs power source 113, but the waveform is not limited to this. Any waveform may be used provided that it is a waveform that can boost by a predetermined value or more. For example, a mountain-shaped voltage shift may be used.

Figure 12:
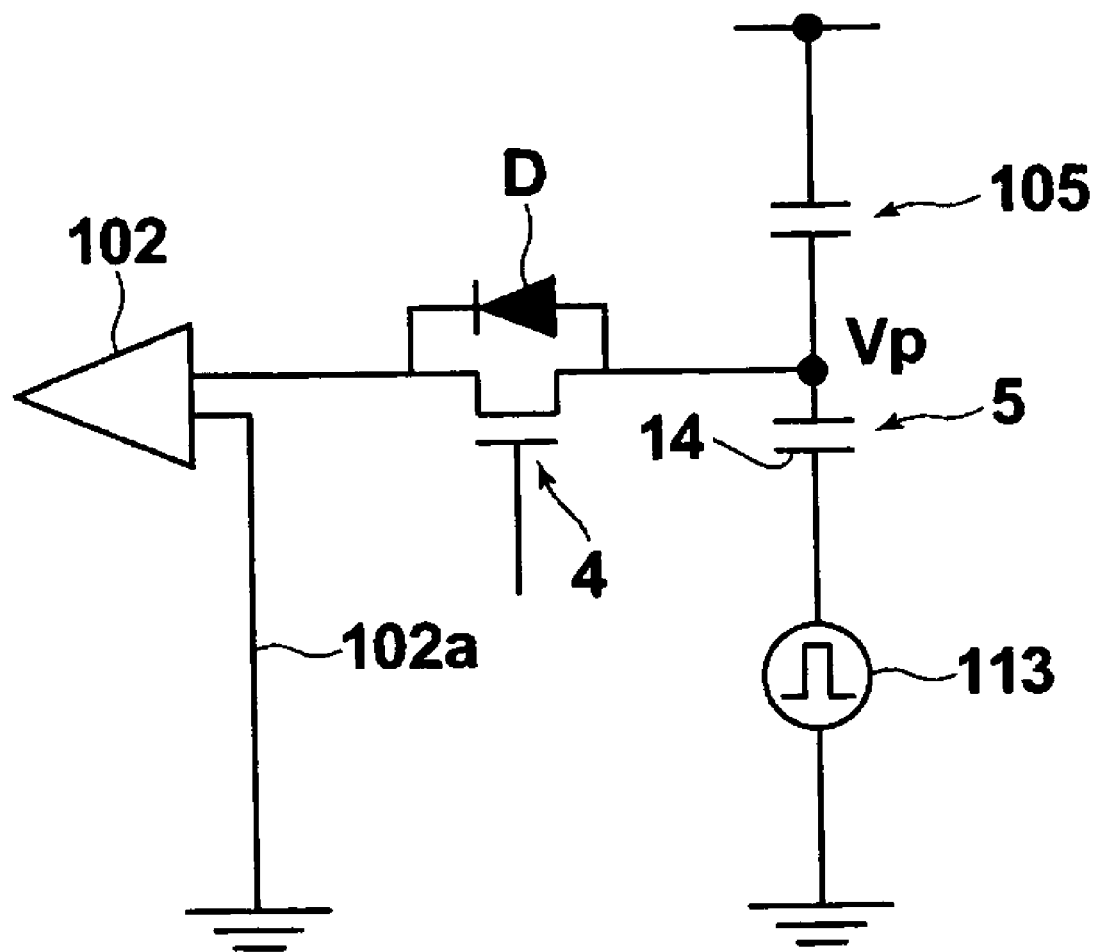
FIG. 12 is an equivalent circuit diagram of one pixel unit of a radiographic image detector shown in FIG. 11.

An equivalent circuit diagram of one pixel of the radiographic image detector of the second exemplary embodiment is shown in FIG. 12.

The variable Cs power source 113 may be provided on a peripheral circuit substrate that is provided separately from the radiographic image detector 101, or may be provided at the radiographic image detector 101.

In the radiographic image detecting system of the first exemplary embodiment, because the variable Cs power source 106 is configured from a DC voltage source and a switch, switching noise arises at the time of switching the switch. However, by structuring the variable Cs power source 113 only from a voltage source as in the present exemplary embodiment, such switching noise can be eliminated.

Other structures and operations are similar to those of the radiographic image detecting system of the first exemplary embodiment.

A radiographic image detecting system relating to a third exemplary embodiment will be described next.

Because the structure of the radiographic image detecting system relating to the third exemplary embodiment is similar to that of the radiographic image detecting system of the first exemplary embodiment, detailed description of the structure is omitted.

Figure 16:
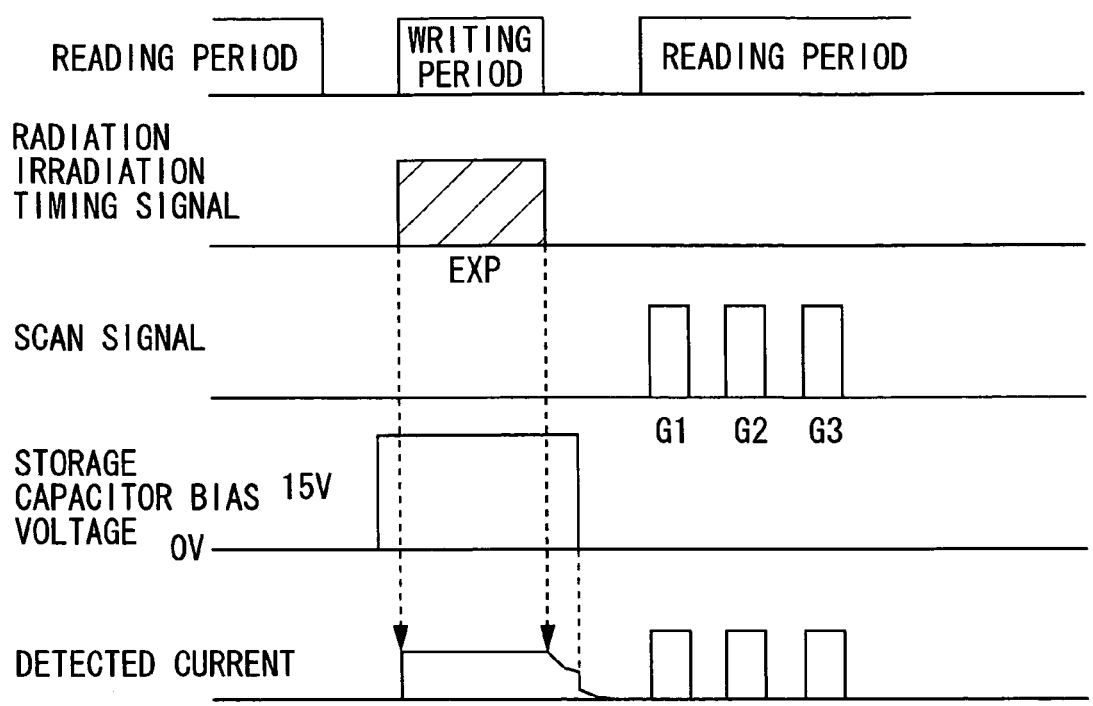
FIG. 16 is a timing chart for explaining an embodiment of a method of driving an image detector relating to a third exemplary embodiment of the present invention.

The method of driving a radiographic image detector relating to the present exemplary embodiment will be described next by using FIG. 16. FIG. 16 shows a timing signal of the irradiation of radiation onto the radiographic image detector 101, a scan signal that controls the on/off of the TFT switch 4 and is outputted from the scan signal controlling device 103, bias voltage that is applied to the charge storage capacitor 5 by the variable Cs power source 106, and detected current detected by the signal detector 102.

First, in the image detection device of the present invention, when image detection is carried out, outputting of the Cs power source switching signal from the signal processing device 104 to the variable Cs power source 106 is started before the writing period. The switch 106b is switched by this signal such that voltage is applied from the DC voltage source 106a to the Cs electrode 14, and the Cs electrode 14 of the charge storage capacitor 5 is boosted to the potential Vcs.

Then, in the writing period, radiation is irradiated onto the radiographic image detector 101. In this writing period, the Cs electrode 14 structuring the charge storage capacitor is maintained at the potential Vcs.

During the writing period, the potential Vp of the charge collecting electrode 11 rises depending on the amount of irradiated radiation, with the potential Vcs of the Cs electrode 14 being the reference. For example, if the potential Vcs of the Cs electrode 14 is 10 V and the potential Vp becomes 25 V with the potential of the potential Vcs of the Cs electrode 14 being the reference, in actuality, the potential Vcs of the Cs electrode 14 is 35 V.

As shown in FIG. 6, leak current of 100 pA flows to the data line 3 via the TFT switch 4 in accordance with the potential of the potential Vcs of the Cs electrode 14.

Then, after a predetermined time period elapses after the writing period has ended, outputting of the Cs power source switching signal from the signal processing device 104 to the variable Cs power source 106 is stopped. In this way, the switch 106b of the variable Cs power source is switched, the Cs electrode 14 of the charge storage capacitor 5 is connected to GND, and the potential Vp of the charge collecting electrode 11 returns to a potential that is based on GND. In this way, Vp decreases 10 V, and becomes around 15 to 20 V. At this time, the leak current falls around several pA. By varying the voltage Vcs that is applied to the Cs electrode 14 of the charge storage capacitor 5 in this way, the leak current can be decreased.

Next, a scan signal is outputted from the scan signal controlling device 103 to the scan lines G1, G2, G3 successively. The TFT switches 4 connected to the scan lines G1, G2, G3 are successively turned on, and the charges accumulated in the charge storage capacitors 5 flow-out to the data lines 3. The charges that flow-out to the data lines 3 are detected by the signal detectors 102 and reading is carried out.

In this way, in accordance with the driving method of the present exemplary embodiment, as described above, leak current flows sufficiently before the image data reading period, and the leak current is reduced sufficiently by the time of the image data reading period, and thereafter, reading of the image data is carried out. Therefore, effects of leak current during the reading period can be suppressed.

In this way, in accordance with the driving method of the present exemplary embodiment, the time from after the writing period until the start of reading can be shortened.

Namely, in order for the accumulated charges to be stably read out from the respective pixels of the radiographic image detector 101, a given time period (e.g., around 10 ms) is needed from the writing period to the time of boosting the potential of the Cs electrode 14. This is because, if the potential of the Cs electrode 14 is boosted during the irradiation of X-rays, there is the concern that the potential Vp of the charge collecting electrode 11 will suddenly become high and the TFT switch 4 will break. Therefore, a sufficient timing margin is needed from the writing period up to the time of boosting the potential of the Cs electrode 14.

Further, as described above, in order for the leak current to sufficiently flow, the voltage maintaining time is preferably around 100 ms.

Therefore, as shown in FIG. 8, in a case in which the leak current discharging period is made to be separate from the writing period, there is a long time until reading becomes possible.

Thus, as shown in FIG. 16, by boosting the potential of the Cs electrode 14 for a predetermined time period that includes the period in which the electromagnetic waves for recording are irradiated (i.e., the writing period), the aforementioned timing margin and the like can be reduced, and the time from the writing period up to the reading start period can be shortened.

Note that, in the same way as in the first exemplary embodiment, during the aforementioned reading period, it is preferable to make the potential of the reference electrode line 102a (see FIG. 4) of the signal detector 102 and the potential of the Cs electrode 14 structuring the charge storage capacitor 5 be the same level.

The principles of the above-described reducing of leak current will be described next.

The protecting diode of the TFT protecting circuit originally exists in order to protect the TFT switch from breakdown voltage. However, in actuality, by providing the protecting diode, there are also effects on reducing noise that is caused by leak current. If the threshold voltage of the protecting diode can be optimized, noise that is caused by leak current can be reduced.

Figure 13A:
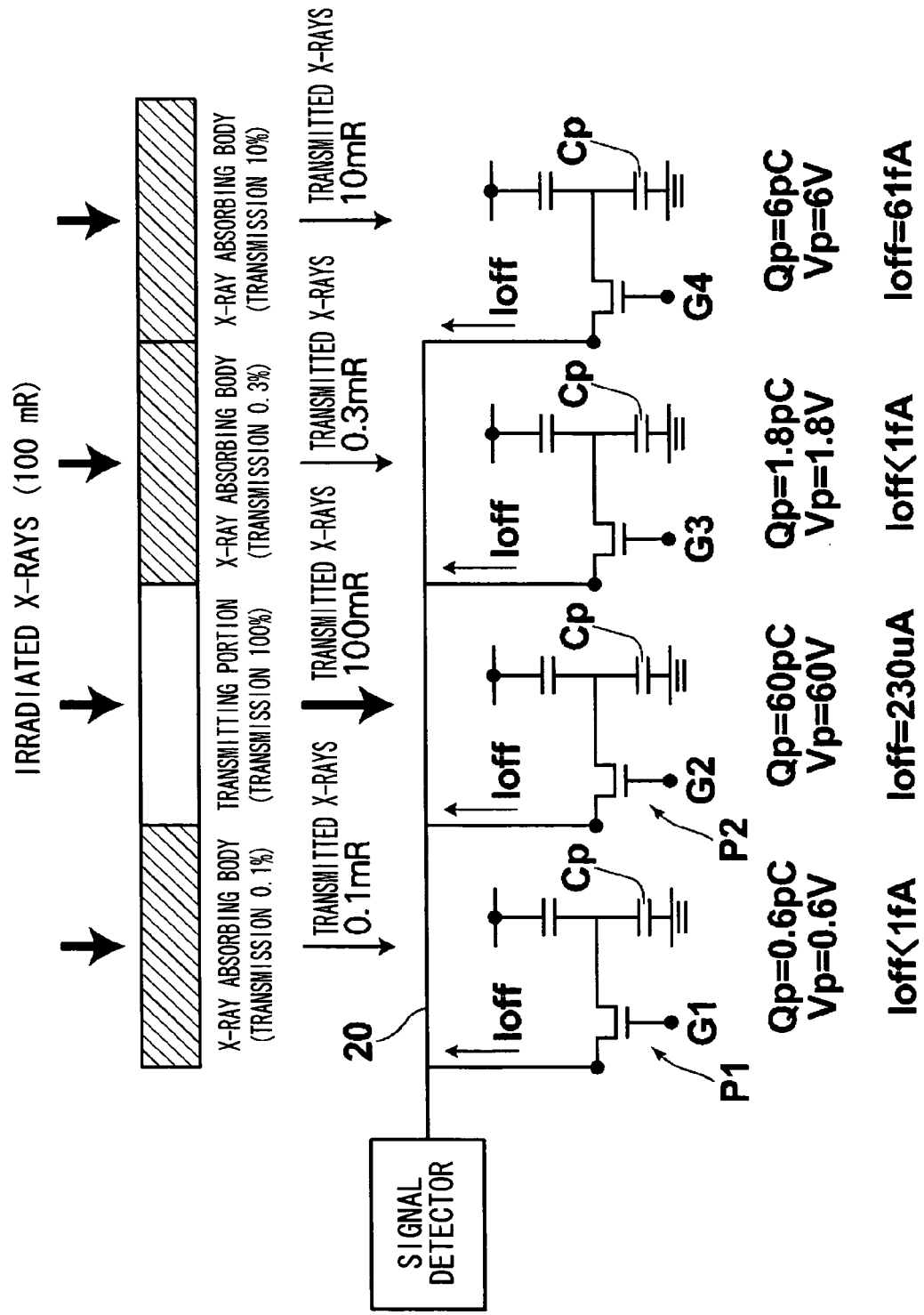
FIG. 13A is a drawing for explaining leak currents of TFT switches in a case in which there are no protecting diodes.
Figure 15:
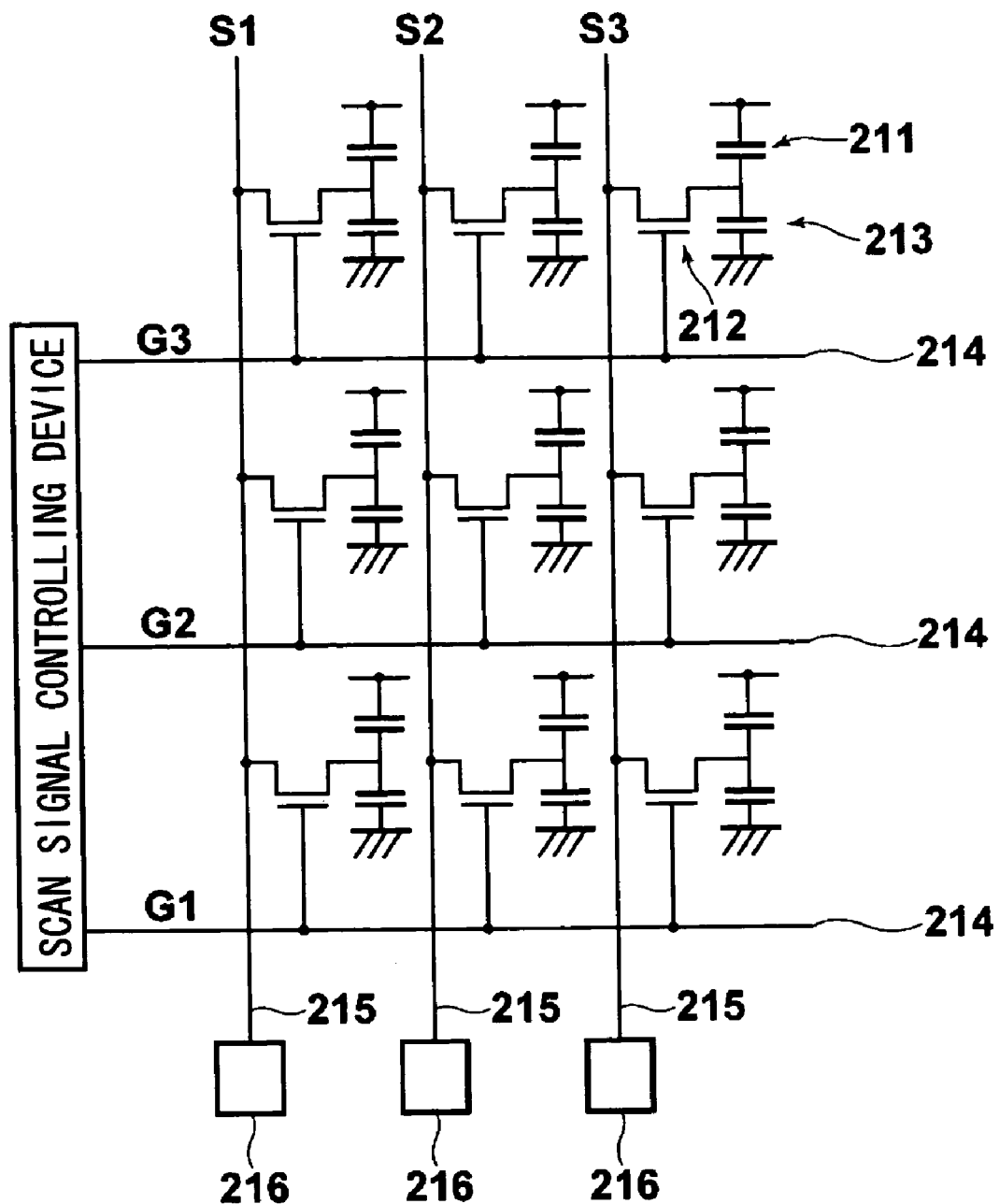
FIG. 15 is a schematic structural diagram of a conventional radiographic image detector.

The mechanism of reducing, by the protecting diode, noise that is caused by leak current will be described in detail by using FIG. 13A and FIG. 13B. FIG. 13A is a diagram for explaining leak current in a case in which there are no protecting diodes, and FIG. 13B is a diagram for explaining leak current in a case in which there are protecting diodes. FIG. 13A and FIG. 13B show an example in which four detecting elements (pixels) are connected to one data line 20.

At the time of X-ray photographing, uniform X-rays are irradiated from an X-ray source onto a radiographic image detector. The object of photographing, which is an X-ray absorbing body such as a human body or the like, is located between the X-ray source and the radiographic image detector. The radiographic image detector detects the X-rays that pass through the X-ray absorbing body and are damped. First, considering the case shown in FIG. 13A of a structure in which there are no protecting diodes, at detecting element P1 in FIG. 13A for example, the transmissivity of the X-ray absorbing body is 0.1%. Therefore, only 0.1 mR of X-rays of 100 mR are irradiated onto the detecting element. In accordance therewith, charges are generated at the semiconductor layer, and charge amount Qp is accumulated in the charge collecting electrode. Here, if the charge converting efficiency of the semiconductor layer is 6 pC per 1 mR, Qp is 0.6 pC. Further, if a charge accumulating capacity Cp of the detecting element is 1 pF, the potential Vp of the charge collecting electrode is 0.6 V. The leak current Ioff at this time is, from FIG. 5, less than or equal to 1 fA (less than or equal to the measuring limit).

On the other hand, at a detecting element of the transmitting portion where the subject of photographing does not exist (detecting element P2 of FIG. 13A), Qp=60 pC and Vp=60 V, and the leak current reaches 230 μA. Because the leak current is current that flows at the time of the off operation of the TFT switch, the leak currents of all of the detecting elements connected to the data line 20 are imparted as leak current noise in the case of acquiring image data of a predetermined detecting element. Therefore, in a case in which a detecting element holding a large amount of accumulated charges exists among the detecting elements that are connected to the same data line, the effects thereof are extremely great.

On the other hand, the structure shown in FIG. 13B having protecting diodes is considered. At a detecting element of the transmitting portion where the subject of photographing does not exist (the detecting element P2 in FIG. 13B), Qp=60 pC and Vp=60 V temporarily. However, simultaneously, the protecting diode activates and the excess charges are leaked to the data line 20. Leak current exceeding 10 nA at maximum flows through the protecting diode and the accumulated charge amount decreases. As a result, the potential of the charge collecting electrode falls to a vicinity of the protecting diode driving threshold voltage of 25 V, and therefore, the leak current amount also decreases to 10 μA. Reading out of the image data is carried out after leakage through the protecting diode has been carried out sufficiently. Therefore, the leak current of the protecting diode does not contribute to leak current noise. In this way, noise due to leak current becomes less than or equal to 1/20 of that in a case in which there is no TFT protecting circuit.

There are many cases in which the above-described current amount of the protecting diode is insufficient for the object of reducing leak current noise. Further, the radiation amount needed as X-ray information is usually less than or equal to 10 mR, although it differs in accordance with the target system. If the threshold voltage of the TFT protecting circuit can be made to be low, leak current noise can be further reduced and image quality can be improved.

Such problems can be overcome by employing the radiographic image detection device and method of driving a radiographic image detector of the present invention.

As described above, a case in which the potential Vcs of the charge storage capacitor is boosted and, due thereto, the potential Vp of the charge collecting electrode is maintained 10 V higher for a given time period, is as in FIG. 14. Namely, at a detecting element of the transmitting portion (the detecting element P2 in FIG. 14), due to the irradiation of X-rays of 100 mR, Qp=60 pC and Vp=60 V temporarily, but the excess charges are leaked to the data line 20 due to the boosting by the protecting diode and Vcs. As a result, the potential of the charge collecting electrode falls to a vicinity of the threshold voltage of 25 V of the protecting diode. Thereafter, until the reading out of the image data, Vp is returned to its original state by Vcs. Therefore, the potential of the charge collecting electrode falls to around 15 V, and as a result, the leak current amount decreases to 1.6 μA. In the same way as described above, reading out of the image data is carried out after leaking through the protecting diode has been carried out sufficiently. Therefore, the leak current of the protecting diode does not contribute to leak current noise.

The above first and third exemplary embodiments describe cases of using the direct-conversion-type radiographic image detector 101 in which radiation is directly converted into charges at the semiconductor film 6 and the charges are accumulated. However, the present invention is not limited to the same, and may be applied to an indirect-conversion-type radiographic image detector in which radiation is once converted into light at a scintillator of CsI:Tl, GOS (Gd2O2S: Tb), or the like, and the converted light is converted into charges at the semiconductor layer 6 and the charges are accumulated. In particular, in a direct-conversion-type detector, the semiconductor film 6 must be made thick in order to directly convert the radiation into charges, and, as compared with the case of an indirect-conversion-type detector, a higher voltage is applied from the high voltage power source 108 to the bias electrode 7, and therefore, it is easier for problems due to leak current to appear. Thus, the effects of leak current can be suppressed by employing the above-described driving methods of the first and third exemplary embodiments. Note that, in the case of an indirect-conversion-type detector, there is a structure in which radiation is converted into light at a scintillator, and the converted light is converted into charges at the semiconductor layer 6. Therefore, as compared with the case of a direct-conversion-type detector, the semiconductor film 6 can be made to be thin and charges can be accumulated at the charge collecting electrode 11 without providing the charge storage capacitor 5. However, there are cases in which a capacitor is provided intentionally in order to increase the amount of charge that can be accumulated. An auxiliary capacitor, a parasitic capacitor, or a stray capacitor which is provided intentionally in this way in an indirect-conversion-type detector corresponds to the storage capacitor of the present invention.

Figure 17:
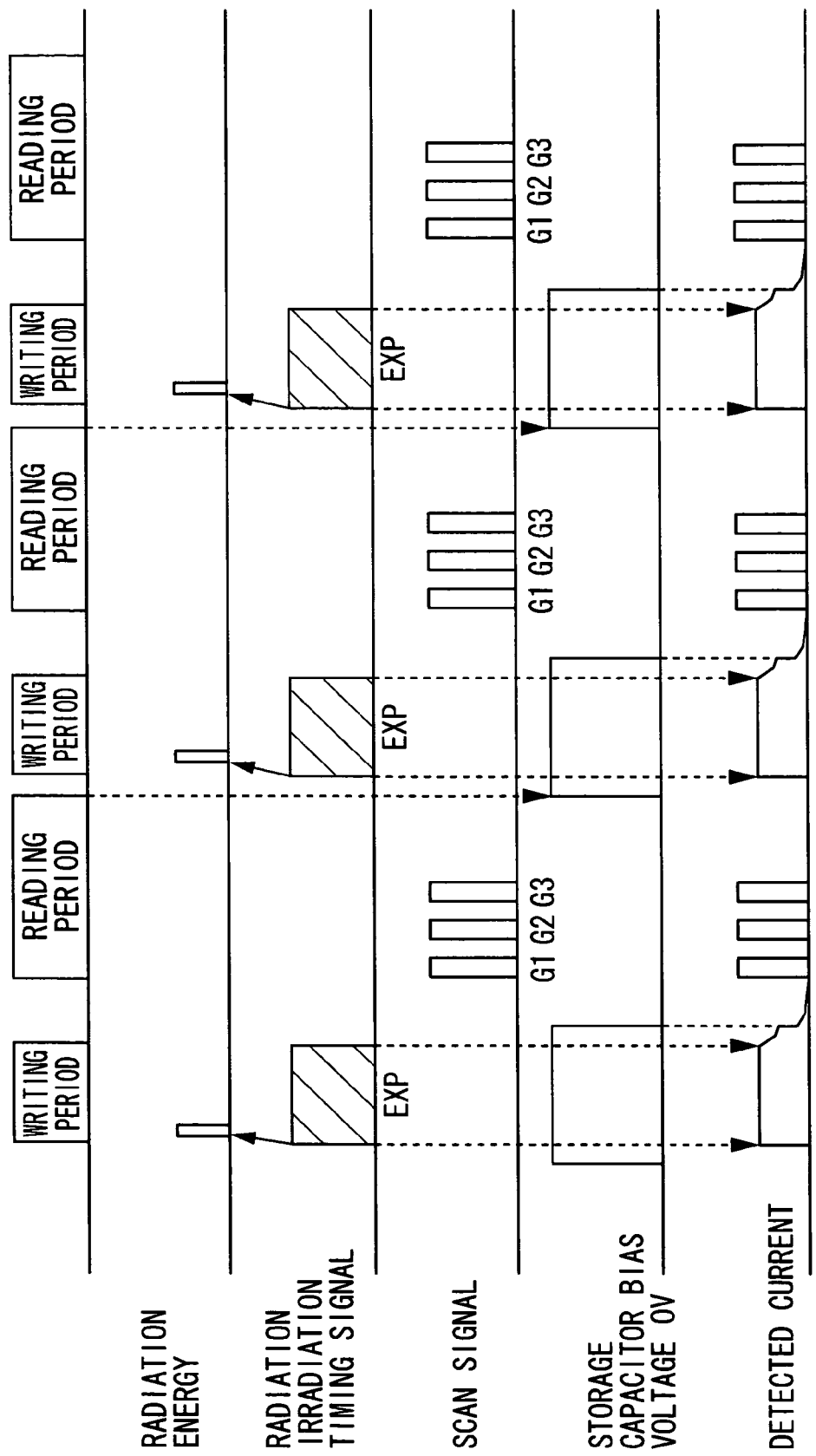
FIG. 17 is a timing chart for explaining an embodiment of the method of driving an image detector at the time of picking-up a moving image.

The above first and third exemplary embodiments describe cases of reading the image data of one image. However, as shown in FIG. 17, moving images also can be obtained by repeatedly and successively carrying out irradiation of radiation onto the radiographic image detector 101 and reading of image data from the radiographic image detector 101. As described above, because the time over which the leak current decreases can be shortened in the above-described driving methods of the first and third exemplary embodiments, these driving methods are suited to the picking-up of moving images.

Further, there is a photographing method such as follows: radiographic images are photographed two or more times in succession while varying the radiation amount (energy) of the irradiated X-rays. Differences in the changes of the absorption coefficients due to the radiation quality can be imaged by carrying out, on each of the images obtained by photographing, image processing such as applying appropriate weights to the images and computing the differences, or the like. For example, the image of bones can be removed from an image in which the chest region is photographed, or the like. In this way, an image which would be difficult to visually recognize by a single photographing is obtained.

Such a photographing method is premised on the object of photographing not moving, and therefore, images must be acquired at a short of a photographing interval as possible.

For example, FIG. 18 is an example of two-shot energy subtraction photographing in which high-energy photographing is carried out the first time and low-energy photographing is carried out the second time.

As shown in FIG. 18, during the writing period at the time of photographing the first time, voltage is applied from the DC voltage source 106a to the Cs electrode 14, and the Cs electrode 14 is maintained at the potential Vcs. The time over which the leak current decreases can thereby be shortened, and therefore, the time until photographing of the second time can be shortened. Note that, in a case in which it is known in advance that the amount of leak current that is generated is small, the application of voltage from the DC voltage source 106a to the Cs electrode 14 may be eliminated. In FIG. 18, the second time is low-energy photographing, and the amount of leak current that is generated is small. Therefore, voltage is not applied from the DC voltage source 106a to the Cs electrode 14. In this way, the reading period of the image data obtained by the photographing of the second time can be quickened.

What is claimed is:

1. An image detection device comprising:
    an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor;
    a power source section connected so as to be able to apply voltage to the one electrode; and
    a control section that controls voltage applied from the power source section to the one electrode so as to promote the leak current through the switching element, for a predetermined time period before the charges accumulated in the storage capacitor are read out from the image detector.

2. The image detection device of claim 1, wherein the control section effects control such that the voltage is applied to the one electrode for the predetermined time period, which is from after electromagnetic waves for recording are irradiated onto the image detector until before the charges are read out from the image detector.

3. The image detection device of claim 1, wherein the control section effects control such that the voltage is applied to the one electrode for the predetermined time period which includes a period when electromagnetic waves for recording are being irradiated onto the image detector.

4. The image detection device of claim 1, wherein the switching element is configured such that current flows when charges are accumulated in the storage capacitor and the potential of the other electrode becomes greater than or equal to a given value.

5. The image detection device of claim 1, wherein the power source section is provided at a peripheral circuit substrate that is provided separately from the image detector.

6. The image detection device of claim 1, further comprising a signal detector that detects an accumulated charge amount by detecting a potential of a charge signal read out from the detection section of the image detector, wherein, at a time of detecting the potential of the charge signal, a potential of a reference electrode line, that is a reference of detection at the signal detector, and the potential of the one electrode constituting part of the storage capacitor, are the same potential level.

7. The image detection device of claim 1, wherein the predetermined time period is from 100 μs to 1 s.

8. An image detection device comprising:
    an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor; and
    a voltage application circuit applying a controlled voltage to the one electrode, so as to vary leak current from the switching element.

9. The image detection device of claim 8, wherein application of voltage to the one electrode by the voltage application circuit is carried out for a predetermined time period before the charges accumulated in the storage capacitor are read out from the image detector.

10. The image detection device of claim 9, wherein the predetermined time period is a period after electromagnetic waves for recording are irradiated onto the image detector.

11. The image detection device of claim 9, wherein the predetermined time period includes a period when electromagnetic waves for recording are irradiated onto the image detector.

12. The image detection device of claim 8, wherein the switching element is configured such that current flows when charges are accumulated in the storage capacitor and the potential of the other electrode becomes greater than or equal to a given value.

13. The image detection device of claim 8, wherein the voltage application circuit is provided at a peripheral circuit substrate that is provided separately from the image detector.

14. The image detection device of claim 8, further comprising a signal detector that detects an accumulated charge amount by detecting a potential of a charge signal read out from the detection section of the image detector, wherein, at a time of detecting the potential of the charge signal, a potential of a reference electrode line, that is a reference of detection at the signal detector, and the potential of the one electrode constituting part of the storage capacitor, are the same potential level.

15. The image detection device of claim 8, wherein the predetermined time period is from 100 μs to 1 s.

16. The image detection device of claim 8, wherein the voltage application circuit is configured such that a rectangular-wave-shaped voltage can be outputted.

17. A method of driving an image detector equipped with a detection section having a charge generation section that receives irradiation of electromagnetic waves for recording and generates charges, a storage capacitor in which two electrodes are disposed so as to oppose one another and which accumulates charges generated at the charge generation section and at which, in accordance with an accumulated charge amount and with a potential of one electrode as a reference, a potential of another electrode varies, and a TFT switching element for reading out charges accumulated in the storage capacitor, the method comprising:
    generating electromagnetic waves for recording, and irradiating the electromagnetic waves onto the charge generation section;
    for a predetermined time period before a point in time of reading out the charges from the storage capacitor via the switching element, varying a voltage applied to the one electrode so as to promote leak current through the switching element; and
    operating the switching element and detecting the charges accumulated in the storage capacitor.

18. The method of driving an image detector of claim 17, wherein the predetermined time period is a period after electromagnetic waves for recording are irradiated onto the image detector.

19. The method of driving an image detector of claim 17, wherein the predetermined time period includes a period when electromagnetic waves for recording are irradiated onto the image detector.

20. The method of driving an image detector of claim 17, wherein the switching element is configured such that current flows when charges are accumulated in the storage capacitor and the potential of the other electrode becomes greater than or equal to a given value.

* * * * *